United States Patent
Su

(10) Patent No.: US 11,638,375 B2
(45) Date of Patent: Apr. 25, 2023

(54) METHOD FOR PREPARING SEMICONDUCTOR MEMORY DEVICE WITH AIR GAPS FOR REDUCING CAPACITIVE COUPLING

(71) Applicant: NANYA TECHNOLOGY CORPORATION, New Taipei (TW)

(72) Inventor: Kuo-Hui Su, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/550,369

(22) Filed: Dec. 14, 2021

(65) Prior Publication Data

US 2022/0102355 A1 Mar. 31, 2022

Related U.S. Application Data

(62) Division of application No. 16/857,890, filed on Apr. 24, 2020, now Pat. No. 11,444,087.

(51) Int. Cl.
*H10B 12/00* (2023.01)
*H01L 23/532* (2006.01)
*H01L 21/768* (2006.01)

(52) U.S. Cl.
CPC ..... *H10B 12/0335* (2023.02); *H01L 21/7682* (2013.01); *H01L 23/53295* (2013.01);
(Continued)

(58) Field of Classification Search
CPC .......... H01L 27/10855; H01L 21/7682; H01L 23/53295; H01L 27/10814; H01L 27/10823; H01L 27/10876; H01L 27/10885; H01L 27/10805; H01L 21/76895; H01L 21/76897; H01L 23/5386;
(Continued)

(56) References Cited

U.S. PATENT DOCUMENTS

2008/0121960 A1* 5/2008 Ohuchi ............... H01L 21/7687
257/E29.345
2014/0291804 A1* 10/2014 Kim ..................... G11C 11/4099
257/532

(Continued)

OTHER PUBLICATIONS

Office Action dated Feb. 9, 2022 related to U.S. Appl. No. 16/857,890, wherein this application is a DIV of U.S. Appl. No. 16/857,890.

*Primary Examiner* — Jonathan Han
(74) *Attorney, Agent, or Firm* — Xuan Zhang

(57) ABSTRACT

The present disclosure provides a method for preparing a semiconductor memory device with air gaps for reducing capacitive coupling between a bit line and an adjacent conductive feature. The method includes forming an isolation member defining an active region in a substrate and a doped area in the active region; forming a gate structure in the substrate, wherein the gate structure divides the doped are into a first doped region and a second doped region; forming a bit line structure on the first doped region; forming an air gap adjacent to the bit line structure; forming a capacitor plug on the second doped region and a barrier layer on a sidewall of the capacitor plug; and forming a landing pad on a top portion of the capacitor plug, wherein the landing pad comprises a first silicide layer over the protruding portion and a second silicide layer on a sidewall of the barrier layer.

10 Claims, 30 Drawing Sheets

(52) U.S. Cl.
CPC ......... *H10B 12/053* (2023.02); *H10B 12/315* (2023.02); *H10B 12/34* (2023.02); *H10B 12/482* (2023.02)

(58) Field of Classification Search
CPC ... H01L 28/40; H10B 12/0335; H10B 12/053; H10B 12/315; H10B 12/34; H10B 12/482; H10B 12/30
See application file for complete search history.

(56) References Cited

U.S. PATENT DOCUMENTS

| | | | |
|---|---|---|---|
| 2015/0014759 A1* | 1/2015 | Lee | H01L 23/5226 257/306 |
| 2015/0056801 A1* | 2/2015 | Park | H01L 21/76814 438/655 |
| 2016/0315088 A1* | 10/2016 | Kang | H01L 27/10876 |
| 2018/0342517 A1* | 11/2018 | Takesako | H01L 23/5283 |
| 2019/0165095 A1 | 5/2019 | Cheng et al. | |
| 2019/0378909 A1 | 12/2019 | Cheng et al. | |
| 2020/0105867 A1 | 4/2020 | Lee et al. | |
| 2020/0111886 A1 | 4/2020 | Ando et al. | |
| 2020/0126843 A1 | 4/2020 | Tsai et al. | |

* cited by examiner

METHOD FOR PREPARING SEMICONDUCTOR MEMORY DEVICE WITH AIR GAPS FOR REDUCING CAPACITIVE COUPLING

CROSS-REFERENCE TO RELATED APPLICATION

This application is a divisional application of U.S. Non-Provisional application Ser. No. 16/857,890 filed on Apr. 24, 2020, which is incorporated herein by reference in its entirety.

TECHNICAL FIELD

The present disclosure relates to a method for preparing a semiconductor memory device, and more particularly, to a method for preparing a semiconductor memory device with air gaps for reducing capacitive coupling between a bit line and an adjacent conductive feature.

DISCUSSION OF THE BACKGROUND

Semiconductor memory devices are widely used in electronics industries. Semiconductor memory devices may have relatively small sizes, multi-functional characteristics, and/or relatively low manufacture costs. Semiconductor memory devices may be categorized as any one of semiconductor memory devices storing logical data, semiconductor logic devices processing logical data, and hybrid semiconductor memory devices having both the function of the semiconductor memory devices and the function of the semiconductor logic devices.

Relatively high-speed and relatively low-voltage semiconductor memory devices may satisfy desired characteristics (e.g., high speed and/or low power consumption) of electronic devices including semiconductor memory devices. Semiconductor memory devices may be relatively highly integrated. Reliability of semiconductor memory devices may be reduced by relatively high integration density of the semiconductor memory devices.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor memory device comprising: a substrate; an isolation member defining an active region having a first P-type ion concentration in the substrate; a gate structure disposed in the substrate; a first doped region positioned at a first side of the gate structure in the active region; a second doped region positioned at a second side of the gate structure in the active region; a bit line positioned on the first doped region; an air gap positioned adjacent to the bit line; a capacitor plug disposed on the second doped region and a barrier layer on a sidewall of the capacitor plug; and a landing pad on a top portion of the capacitor plug, wherein the landing pad comprises a first silicide layer disposed over a protruding portion of the capacitor plug, and a second silicide layer disposed on a sidewall of the barrier layer.

In some embodiments, the landing pad further comprises a barrier layer between the protruding portion and the second silicide layer.

In some embodiments, a top end of the second silicide layer is higher than a top end of the first silicide layer.

In some embodiments, the first silicide layer and the second silicide layer comprise polysilicon, the first silicide layer comprises tungsten, and the second silicide layer comprises titanium.

In some embodiments, the second silicide layer surrounds the first silicide layer.

In some embodiments, the gate structure comprises: a gate dielectric layer conformally disposed on inner sidewalls of a gate trench; and a lower gate electrode disposed on the gate dielectric layer, and an upper gate electrode disposed on the lower gate electrode, wherein the lower gate electrode has a relatively lower work function than the upper gate electrode.

In some embodiments, the active region has a P-type ion concentration, the lower gate electrode includes polysilicon doped with an N-type ion, and the lower gate electrode is conformally disposed on the gate dielectric layer.

In some embodiments, the semiconductor memory device further comprises an intermediate gate electrode disposed between the lower gate electrode and the upper gate electrode, wherein the intermediate gate electrode includes a barrier metal, and the intermediate gate electrode is conformally disposed on the lower gate electrode.

In some embodiments, the upper gate electrode includes a metal, a metal alloy, or a metal compound, and the upper gate electrode fills the gate trench and has a rail-like shape.

In some embodiments, the semiconductor memory device further comprises a capping gate electrode covering an upper surface of the upper gate electrode, wherein the capping gate electrode includes a lower capping gate electrode and an upper capping gate electrode disposed on the lower capping gate electrode, and the lower capping gate electrode includes a barrier metal, and the upper capping gate electrode includes polysilicon doped with an N-type ion.

Another aspect of the present disclosure provides a method for preparing a semiconductor memory device, comprising: forming an isolation member defining an active region in a substrate and a doped area in the active region; forming a gate structure in the substrate, wherein the gate structure divides the doped are into a first doped region and a second doped region; forming a bit line structure on the first doped region; forming an air gap adjacent to the bit line structure; forming a capacitor plug on the second doped region and a barrier layer on a sidewall of the capacitor plug; and forming a landing pad on a top portion of the capacitor plug, wherein the landing pad comprises a first silicide layer over the protruding portion and a second silicide layer on a sidewall of the barrier layer.

In some embodiments, forming a gate structure in the substrate comprises: forming a gate trench in the substrate; conformally forming a gate dielectric layer on inner sidewalls of the gate trench; forming a lower gate electrode on the gate dielectric layer; and forming an upper gate electrode disposed on the lower gate electrode, wherein the lower gate electrode has a relatively lower work function than the upper gate electrode.

In some embodiments, the active region has a first P-type ion concentration, the lower gate electrode includes polysilicon is doped with an N-type ion, and the lower gate electrode is conformally disposed on the gate dielectric layer.

In some embodiments, the method for preparing a semiconductor memory device further comprises: conformally forming an intermediate gate electrode between the lower gate electrode and the upper gate electrode, wherein the intermediate gate electrode includes a barrier metal.

In some embodiments, the upper gate electrode includes a metal, a metal alloy, or a metal compound, and the upper gate electrode fills the gate trench and has a rail-like shape.

In some embodiments, the method for preparing a semiconductor memory device further comprises: forming a capping gate electrode covering an upper surface of the upper gate electrode, wherein the capping gate electrode includes a lower capping gate electrode and an upper capping gate electrode disposed on the lower capping gate electrode, and the lower capping gate electrode includes a barrier metal, and the upper capping gate electrode includes polysilicon doped with an N-type ion.

In some embodiments, forming an air gap adjacent to the bit line structure comprises: forming a bit line capping layer surrounding an exposed surface of the bit line structure; forming a first bit line spacer on sides of the bit line structure, with the bit line capping layer between the bit line structure and the first bit line spacer; forming a second bit line spacer on sides of the first bit line spacer; and performing an etching process to remove the first bit line spacer.

In some embodiments, forming a landing pad on a top portion of the capacitor plug comprises: exposing a protruding portion of the capacitor plug and a top portion of the barrier layer; forming a liner layer covering the capacitor plug and the barrier layer; and performing a thermal process to form a landing pad over the dielectric layer, wherein the thermal process transforms a portion of the protruding portion and the liner layer into the first silicide layer, and the thermal process transforms a portion of the top portion of the barrier layers and the liner layer into the second silicide layer.

In some embodiments, after the thermal process, a top end of the second silicide layer is higher than a top end of the first silicide layer, and the second silicide layer surrounds the first silicide layer.

In some embodiments, the first silicide layer and the second silicide layer comprise polysilicon, the first silicide layer comprises tungsten, and the second silicide layer comprises titanium.

Due to the introduction of the air gap between two conductive features, i.e., the bit line structure and the capacitor plug, the parasitic capacitance between the two conductive features can be effectively reduced. As a result, the overall device performance may be improved (i.e., the decreased power consumption and resistive-capacitive (RC) delay), and the yield rate of the semiconductor device may be increased.

Furthermore, due to the self-aligned landing pad having the metal silicide, wherein a width of the metal silicide layer is larger than a width of the capacitor plug, the misalignment between the subsequently formed capacitor structure and the landing pad can be effectively solved.

In addition, the work-function adjustment layer having a relatively low work function is disposed outside the conductive layer of the gate structure to reduce or minimize a gate-induced drain leakage current (GIDL) generated from the word line to the doped regions.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
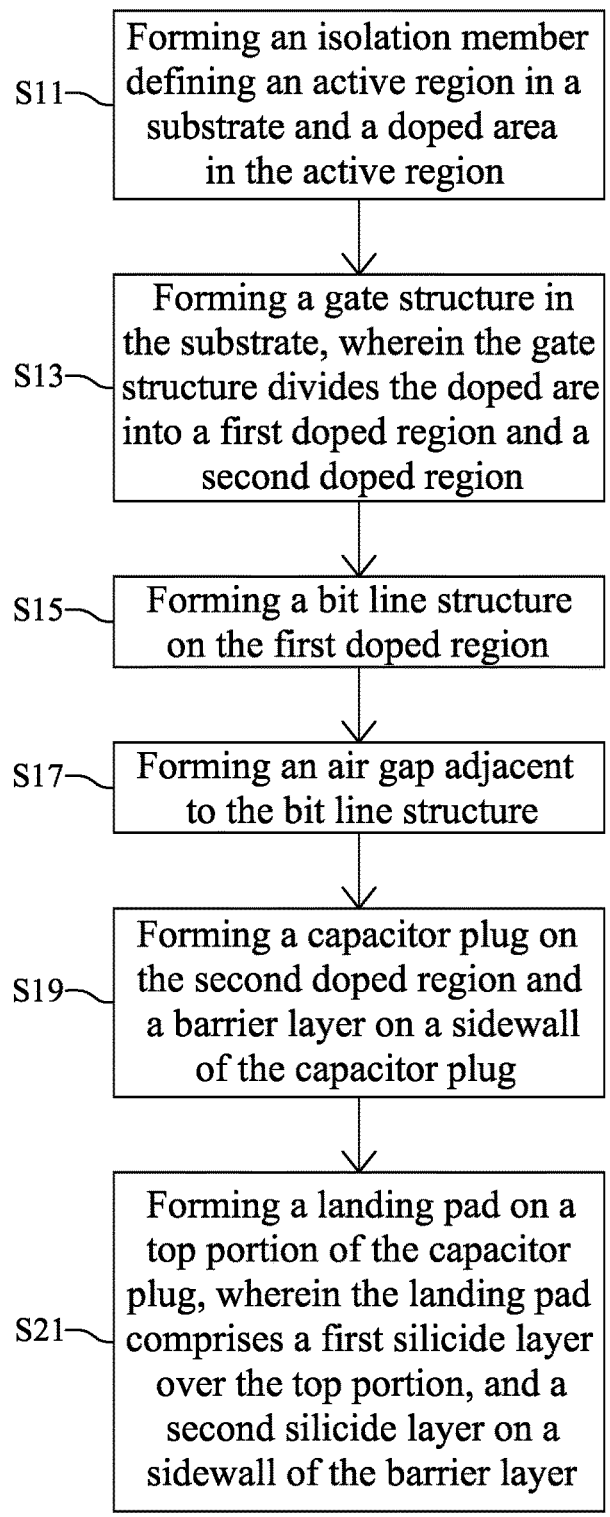
FIG. 1 is a flow diagram illustrating a method for fabricating a semiconductor memory structure with air gaps for reducing capacitive coupling between conductive features according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor memory device generally means a device which can function by utilizing semiconductor characteristics, and an electro-optic device, a light-emitting display device, a semiconductor circuit, and an electronic device are all included in the category of the semiconductor memory device.

It should be noted that, in the description of the present disclosure, above (or up) corresponds to the direction of the arrow of the direction Z, and below (or down) corresponds to the opposite direction of the arrow of the direction Z.

FIG. 1 is a flow diagram illustrating a method 10 for fabricating a semiconductor memory structure 10A with air gaps for reducing capacitive coupling between conductive features according to some embodiments of the present disclosure. The method 10 may be performed as operations. It may be noted that the method 10 may be performed in any order and may include the same, more, or fewer operations. It may be noted that the method 10 may be performed by one or more pieces of semiconductor fabrication equipment or fabrication tools. In some embodiments, the method 10 includes operations (steps) S11, S13, S15, S17, S19 and S21. The steps S11 to S21 of FIG. 1 are elaborated in connection with following figures.

Figure 2:
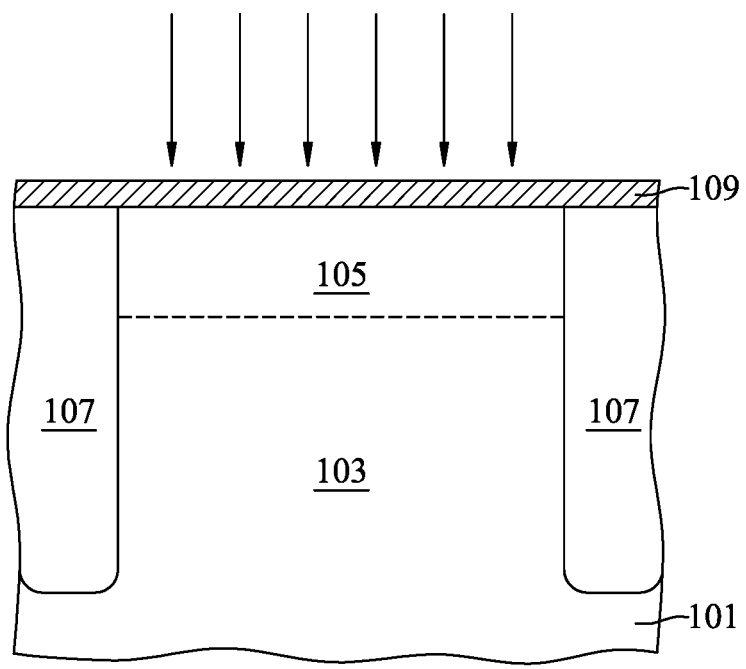
FIG. 2 is a cross-sectional view illustrating an intermediate stage of forming an isolation member defining an active region in a substrate and forming a doped region in the active region at the step S11 in the method shown in FIG. 1, in accordance with some embodiments.

FIG. 2 is a cross-sectional view illustrating an intermediate stage of forming an isolation member defining an active region in a substrate and forming a doped region in the active region at the step S11 in the method 10 shown in FIG. 1, in accordance with some embodiments. In some embodiments, fabrication processes are performed to form an isolation member 107 that defines an active region 103 in a substrate 101. The substrate 101 may include a monocrystalline silicon layer that is lightly doped with a P-type ion such as boron (B). The forming of the isolation member 107 may be implemented by performing a shallow trench isolation (STI) process. In addition, the method may include forming a buffer layer 109 on the surface of the substrate 101, and forming a source/drain region (doped area) 105 in the active region 103 of the substrate 101 through an ion implantation process. The forming of the buffer layer 109 may include thinly oxidizing the surface of the substrate 101 or thinly depositing a silicon oxide on the substrate of the substrate 101. The forming of the source/drain region 105 may include performing an ion implantation process to implant N-type ions such as phosphorous (P) or arsenic (As) into an upper portion of the active region 103 of the substrate 101. Subsequently, the buffer layer 109 may be removed.

Figure 3:
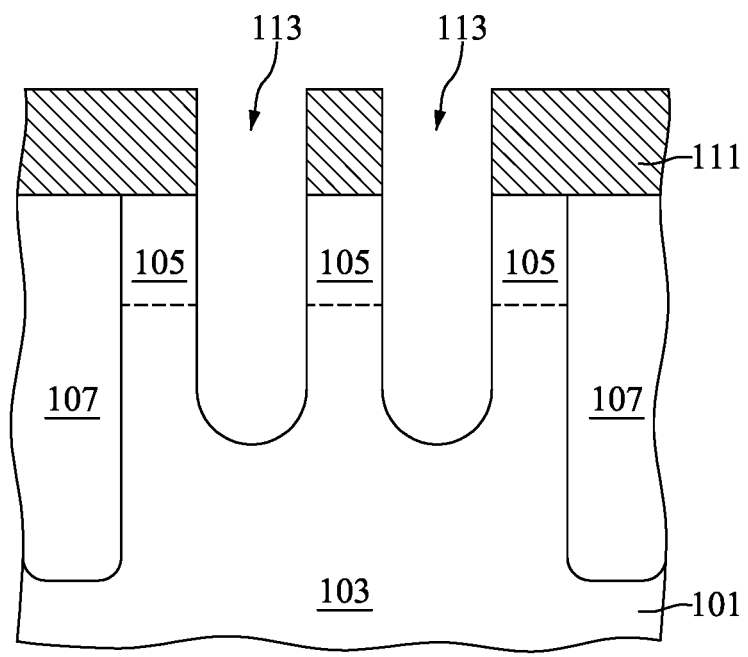
FIG. 3 is a cross-sectional view illustrating an intermediate stage of forming a gate trench in the substrate in accordance with some embodiments.

FIG. 3 is a cross-sectional view illustrating an intermediate stage of forming a gate trench in the substrate in accordance with some embodiments. In some embodiments, fabrication processes are performed to form a first mask pattern 111 on the surfaces of the substrate 101 and the isolation member 107 through a photolithography process, and forming a gate trench 113 through an etch process using the first mask pattern 111 as an etch mask. In some embodiments, the gate trench 113 may be formed as a cylinder-like well, or as a slot-like element that extends in a linear direction through the substrate 101, and may have the same cross-sectional configuration in either case. The first mask pattern 111 may include a photoresist, a silicon oxide, a silicon nitride, a spin-on-hard mask (SOH), or one of combinations thereof.

Figure 4:
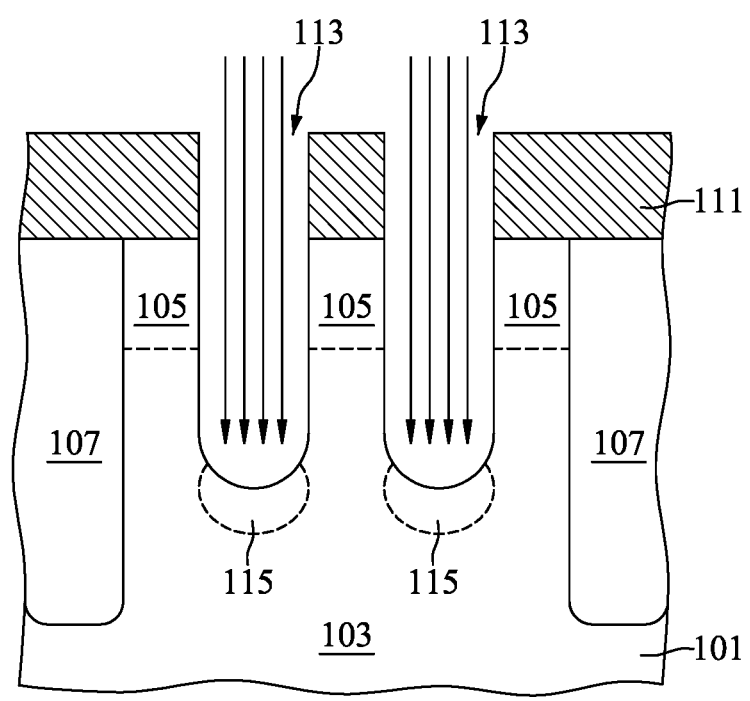
FIG. 4 is a cross-sectional view illustrating an intermediate stage of forming an ion implantation region in the substrate in accordance with some embodiments.
Figure 5:
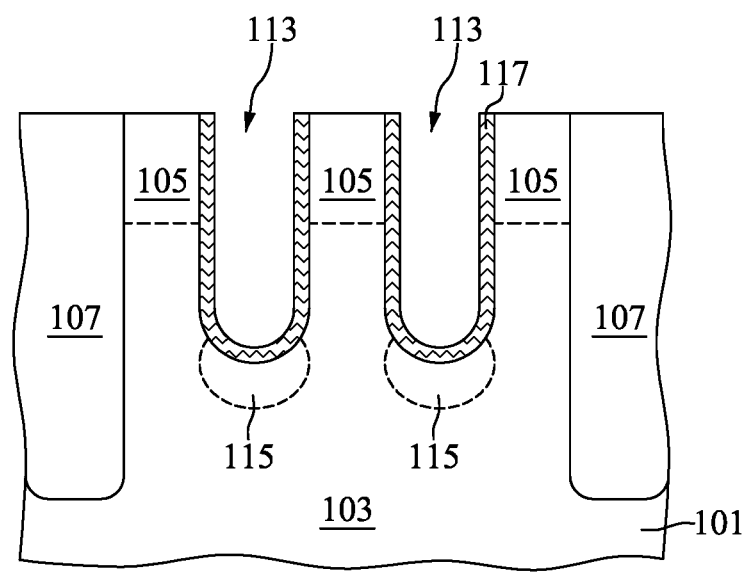
FIGS. 5-10 are cross-sectional views illustrating intermediate stages of forming a gate structure in the substrate and dividing the doped area into doped regions at the step S13 in the method shown in FIG. 1, in accordance with some embodiments.

FIG. 4 is a cross-sectional view illustrating an intermediate stage of forming an ion implantation region in the substrate in accordance with some embodiments. In some embodiments, fabrication processes are performed to form an ion implantation region 115 through an ion implantation process of implanting boron (B) in the active region 103 of the substrate 101, particularly at the bottom of exposed gate trench 113. The forming of the ion implantation region 115 may include implanting boron fluoride ions ($BF_3^+$ and $BF_2^{2+}$) in the active region 103 through a local channel ion implantation method. The local channel ion implantation method may include implanting the boron fluoride ions in the active region 103 of the substrate 101 to an ion concentration of approximately 1E12 ($1\times10^{12}$) to 1E13 ($1\times10^{13}$) ion/cm² in an acceleration energy of approximately 20 to 30 KeV. The ion implantation energy and ion implantation concentration of the boron fluoride ions, which are used to increase a threshold voltage of a channel, may be adjusted and changed in various manners depending on operation conditions and operation characteristics of the channel. Subsequently, the first mask pattern 111 may be removed.

Thereafter, a cleaning process for curing the surface of the substrate 101 exposed in the gate trench 113 may be performed. The cleaning process may include extremely thinly peeling out the surface of the substrate 101 exposed in the gate trench 113. In some embodiments, the ion implantation region 115 may have a pocket or bowl-like shape surrounding the bottom of the gate trench 113. In other words, the ion implantation region 115 may be formed not only on the bottom surface of the gate trench 113 but also partially on the sidewalls of the gate trench 113. However, the ion implantation region 115 may be spaced apart from the source/drain region 105.

FIGS. 5-10 are cross-sectional views illustrating intermediate stages of forming a gate structure in the substrate and dividing the doped area into doped regions at the step S13 in the method 10 shown in FIG. 1, in accordance with some embodiments. In some embodiments, referring to FIG. 5, fabrication processes are performed to form a gate dielectric layer 117 on the inner sidewalls and bottom surface of the gate trench 113. The forming of the gate dielectric layer 117 may include a silicon oxidation process. That is, the surface of the substrate 101 exposed in the gate trench 113 may be oxidized. In some embodiments, the method may include disposing a high-k dielectric layer such as a hafnium oxide ($HfO_x$) layer on the substrate 101 exposed in the gate trench 113 through a deposition process to form gate dielectric layer 117. The silicon oxidation process may include a thermal oxidation process. Accordingly, a separate thermal treatment process (e.g., an anneal process) for diffusing the boron fluoride ions ($BF_3^+$ and $BF_2^{2+}$) in the active region 103 may not be necessary because diffusion can be performed simultaneously in the silicon oxidation process. That is, the thermal treatment process may need to be performed only once. Since it is desirable that the thermal treatment process is performed as few times as possible, deterioration in characteristics of the cryogenic semiconductor memory device attributable to frequent thermal treatment processes may be mitigated or reduced.

Figure 6:
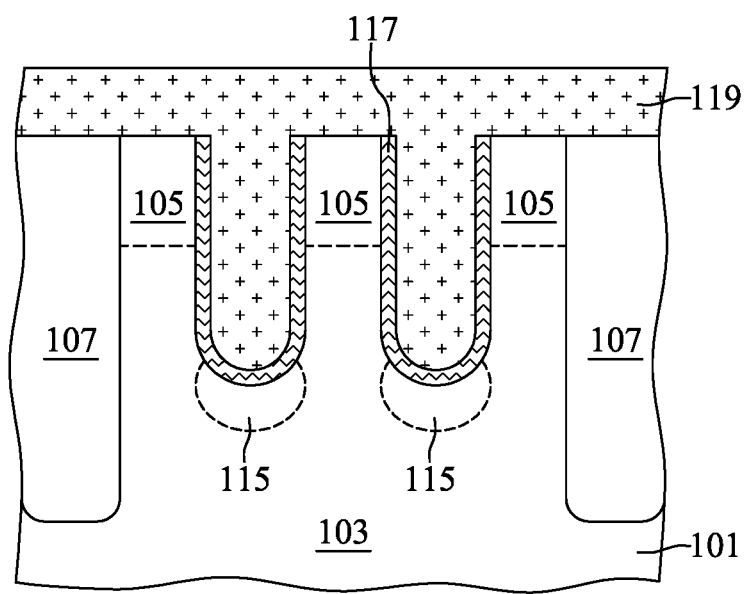

Referring to FIG. 6, fabrication processes are performed to form a lower gate electrode material layer 119 on the gate dielectric layer 117 inside the gate trench 113 and on the surface of the substrate 101 through a deposition process. The lower gate electrode material layer 119 may include a conductor having a relatively low work function. For example, the lower gate electrode material layer 119 may include polysilicon doped with N-type ions. Accordingly, the deposition process may include an N-type doping process and an N-type deposition process for depositing doped silicon. A separate N-type doping process may not need to be performed because N-type ions may be supplied in a gaseous form during the deposition process.

Figure 7:
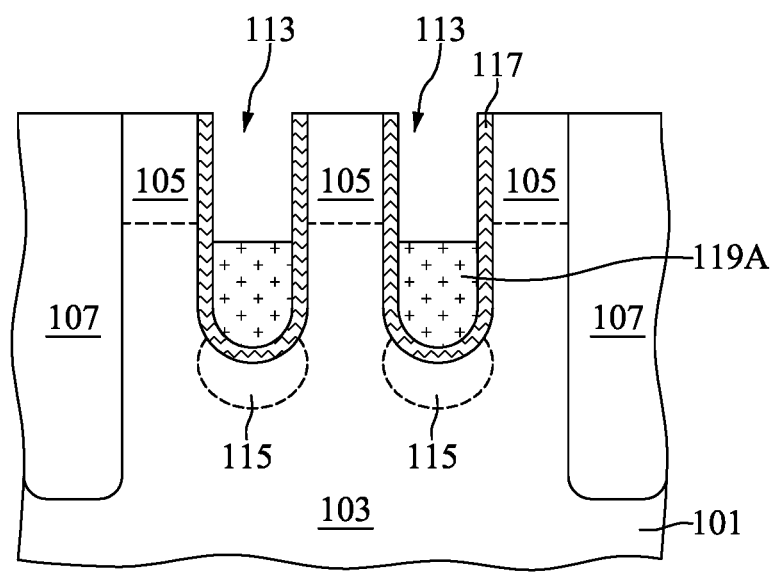

Referring to FIG. 7, fabrication processes are performed to form a lower gate electrode 119A by removing an upper portion of the lower gate electrode material layer 119 through an etch-back process. As the upper portion of the lower gate electrode material layer 119 is removed, the upper surface of the lower gate electrode 119A may be located at a half of the depth of the gate trench 113 or less. For example, the upper surface of the lower gate electrode 119A may be located at a lower level than the bottom of the source/drain region 105.

Figure 8:
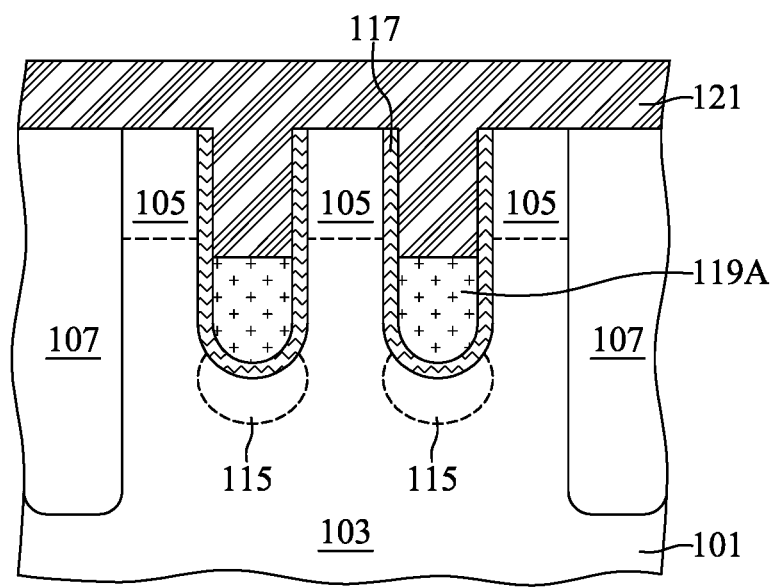

Referring to FIG. 8, fabrication processes are performed to form an upper gate electrode material layer 121 in the gate trench 113 and on the surface of the substrate 101 through a deposition process. The upper gate electrode material layer 121 may include a conductor having a relatively higher work function than the lower gate electrode 119A.

The upper gate electrode material layer 121 may include a material capable of forming an ohmic contact with the lower gate electrode 119A. For example, the upper gate electrode material layer 121 may include a barrier metal. The upper gate electrode material layer 121 may include a titanium nitride (TiN), as an example.

In some embodiments, the upper gate electrode material layer 121 may include a material having a higher work function than the lower gate electrode 119A to a degree sufficient to modify the threshold voltage of a device at low or cryogenic temperatures. For example, the upper gate electrode material layer 121 may include a metal, a metal compound, or a metal alloy. For example, the upper gate electrode material layer 121 may include tungsten (W).

Figure 9:
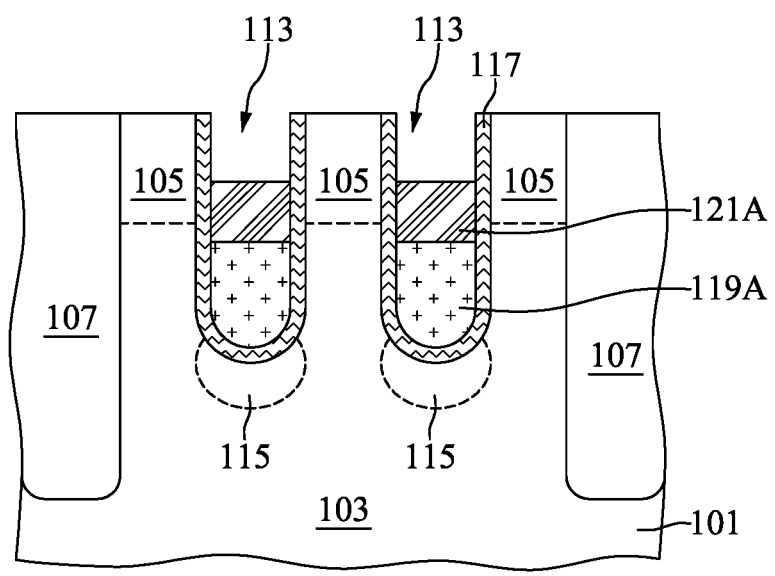

Referring to FIG. 9, fabrication processes are performed to form an upper gate electrode 121A by removing the upper portion of the upper gate electrode material layer 121 through an etch-back process. The upper portion of the upper gate electrode material layer 121 is removed so that the upper surface of the upper gate electrode 121A may be located in the gate trench 113. The upper surface of the upper gate electrode 121A may be located at a higher level than the bottom surface of the source/drain region 105.

Figure 10:
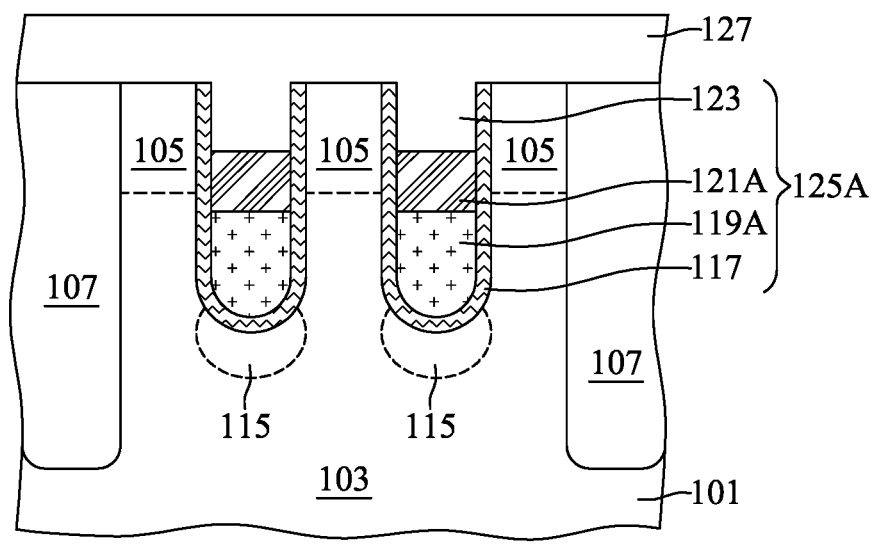

Referring to FIG. 10, fabrication processes are performed to form a gate structure 125A by forming a dielectric gate capping layer 123 to fill the gate trench 113 through a deposition process, and forming a lower interlayer dielectric layer 127 to be stacked on the upper surface of the substrate 101. The gate structure 125A may include the gate dielectric layer 117, the lower gate electrode 119A, the upper gate electrode 121A, and the gate capping layer 123. For example, the gate capping layer 123 may include a silicon nitride, and the lower interlayer dielectric layer 127 may include a silicon oxide. In some embodiments of the present disclosure, the gate capping layer 123 and the lower interlayer dielectric layer 127 may be the same material. For example, the gate capping layer 123 and the lower interlayer dielectric layer 127 may be a silicon nitride or a silicon oxide. When the gate capping layer 123 and the lower interlayer dielectric layer 127 are the same material, the gate capping layer 123 and the lower interlayer dielectric layer 127 may be successively formed during a single process. When the gate capping layer 123 and the lower interlayer dielectric layer 127 are the same material, a chemical mechanical polishing (CMP) process may be performed to planarize the upper surface of the lower interlayer dielectric layer 127. During the CMP process, the gate structure 125A including the gate dielectric layer 117, the lower gate electrode 119A, the upper gate electrode 121A and the gate capping layer 123 may be formed.

Figure 11:
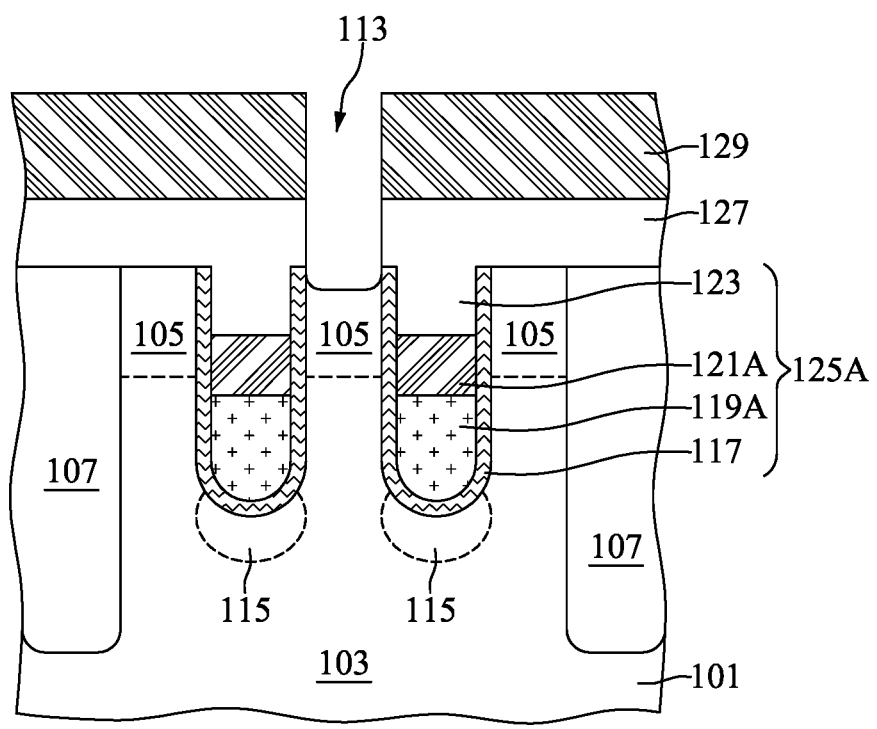
FIGS. 11-13 are cross-sectional views illustrating intermediate stages of forming a bit line structure on the doped region at the step S15 in the method shown in FIG. 1, in accordance with some embodiments.
Figure 12:
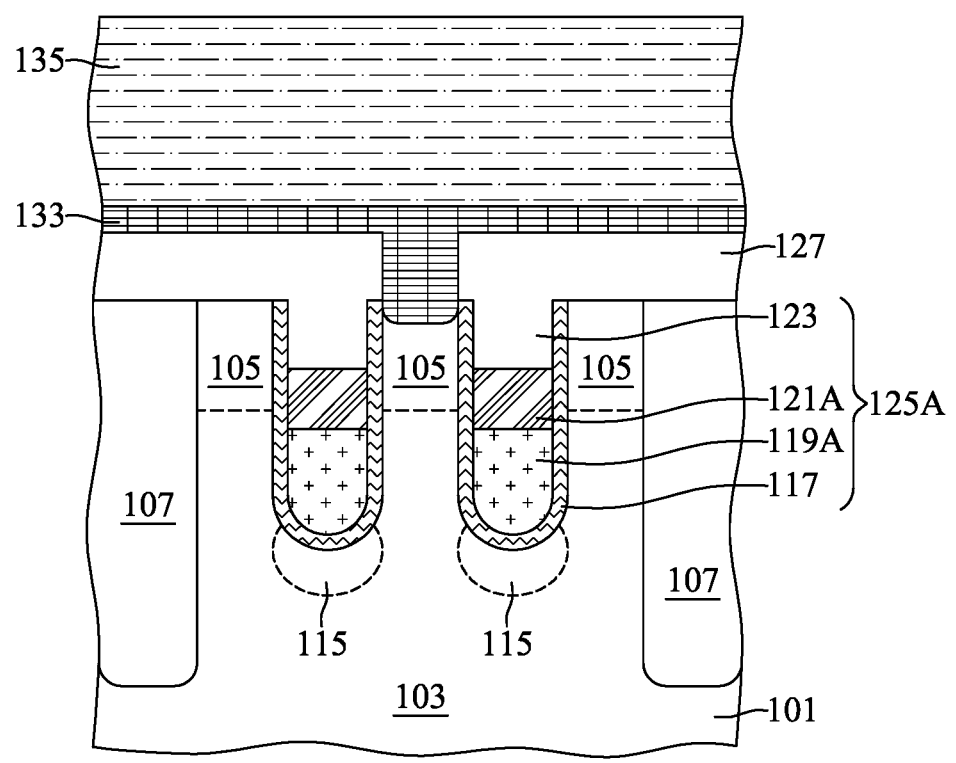
Figure 13:
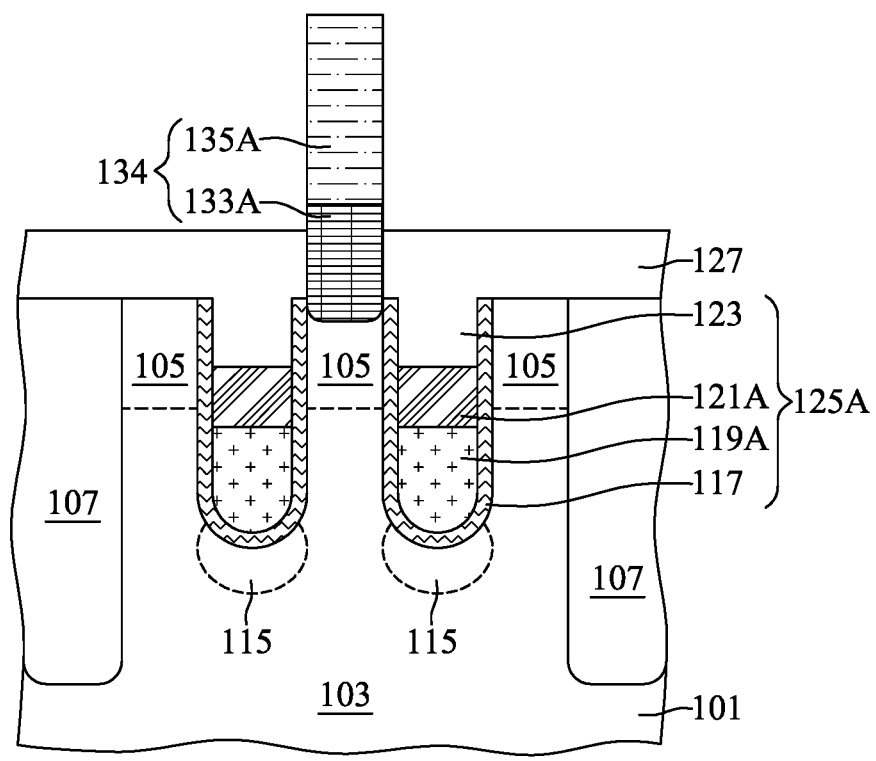
Figure 14:
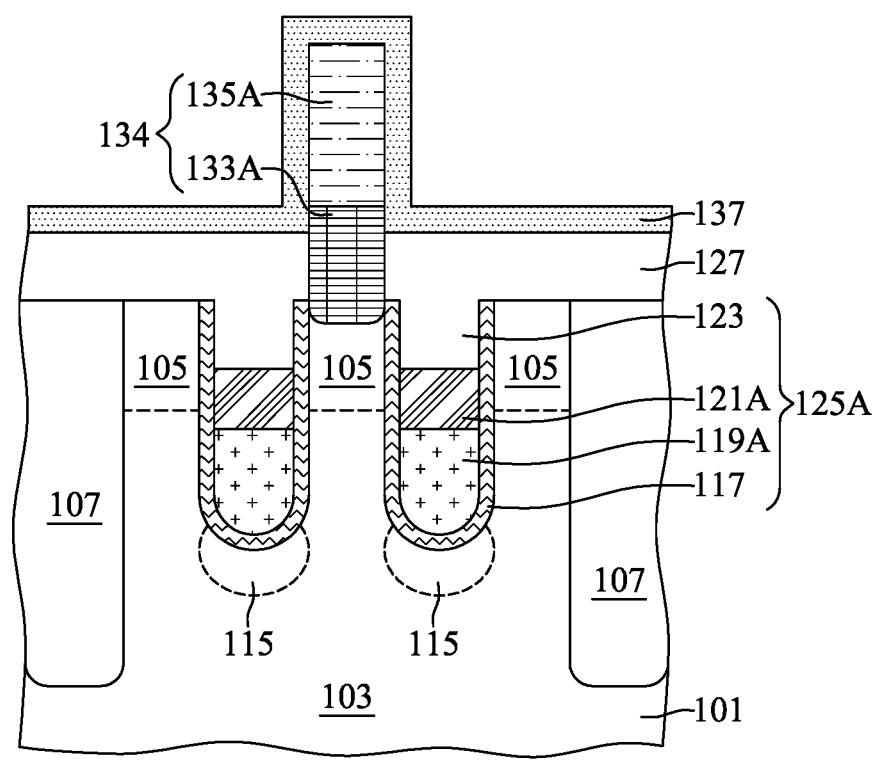
FIGS. 14-18 are cross-sectional views illustrating intermediate stages of forming an air gap adjacent to the bit line structure at the step S17 in the method shown in FIG. 1, in accordance with some embodiments.

FIGS. 11-13 are cross-sectional views illustrating intermediate stages of forming a bit line structure on the doped region at the step S15 in the method 10 shown in FIG. 1, in accordance with some embodiments. In some embodiments, referring to FIG. 11, fabrication processes are performed to form a second mask pattern 129 on the lower interlayer dielectric layer 127 through a photolithography process, and forming a bit line trench 131 through an etch process using the second mask pattern 129 as an etch mask. The bit line trench 131 may expose the source/drain region 105 in the active region 103. Subsequently, the second mask pattern 129 may be removed. In some embodiments of the present disclosure, the bit line trench 131 may have a hole-like or well-like shape. That is, the bit line trench 131 may have the hole-like or well-like shape instead of a trench-like shape. In such cases, the bit line trench 131 may be referred to as a bit line contact hole.

Referring to FIG. 12, fabrication processes are performed to form a conductive lower bit line material layer 133 in the bit line trench 131 and on the lower interlayer dielectric layer 127 through a deposition process, and forming a conductive upper bit line material layer 135 on the lower bit line material layer 133. The lower bit line material layer 133 may be a single layer including doped polysilicon, a metal, a metal silicide or a metal compound, or it may be a multi-layer including any combination of the above materials. The upper bit line material layer 135 may include a metal or a metal compound.

Referring to FIG. 13, fabrication processes are performed to form a bit line structure 134 having a lower bit line 133A and an upper bit line 135A by successively patterning the upper bit line material layer 135 and the lower bit line material layer 133 through an etch process. The lower bit line 133A may have a line shape extending horizontally in a one-dimensional way, or a plug-like or pillar-like shape. The upper bit line 135A may have a line shape extending horizontally in a one-dimensional way.

FIGS. 14-18 are cross-sectional views illustrating intermediate stages of forming an air gap adjacent to the bit line structure at the step S17 in the method 10 shown in FIG. 1, in accordance with some embodiments. In some embodiments, referring to FIG. 14, fabrication processes are performed to form a bit line capping layer 137 that surrounds the exposed surfaces of the lower bit line 133A and the upper bit line 135A. The forming of the bit line capping layer 137 may include conformally forming a dielectric layer such as a silicon nitride layer on the exposed surfaces of lower bit line 133A, the upper bit line 135A and the lower interlayer dielectric layer 127.

Figure 15:
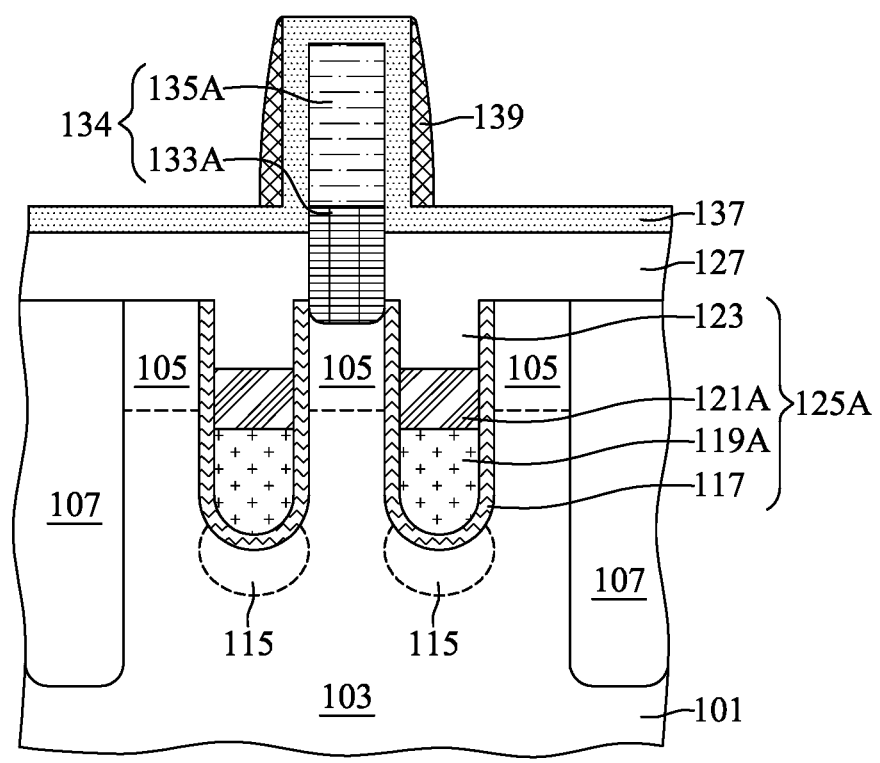

Referring to FIG. 15, fabrication processes are performed to form a first bit line spacer 139 on the sides of the lower bit line 133A and the upper bit line 135A, with the intervening bit line capping layer 137. The forming of the first bit line spacer 139 may include conformally forming a dielectric layer such as a doped silicon oxide layer on the exposed surfaces of the bit line capping layer 137, and performing an etch-back (spacer etching) process.

Figure 16:
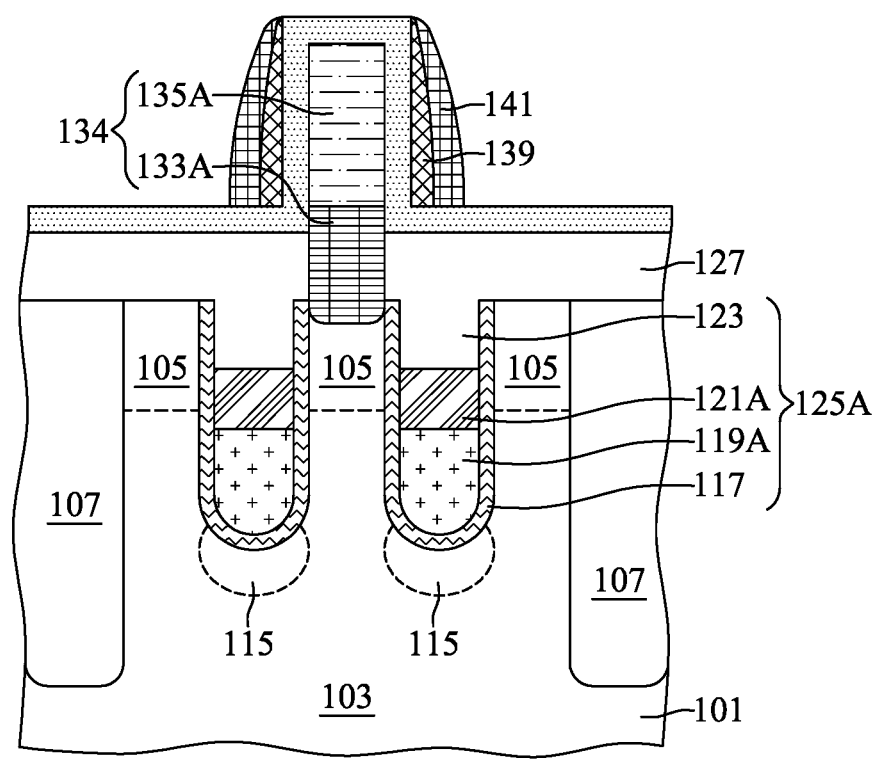

Referring to FIG. 16, fabrication processes are performed to form a second bit line spacer 141 on the sides of the lower bit line 133A and the upper bit line 135A, with the intervening bit line capping layer 137 and first bit line spacer 139. The forming of the second bit line spacer 141 may include conformally forming a dielectric layer such as a silicon nitride layer on the exposed surfaces of the bit line capping layer 137 and the first bit line spacer 139, and performing an etch-back (spacer etching) process.

Figure 17:
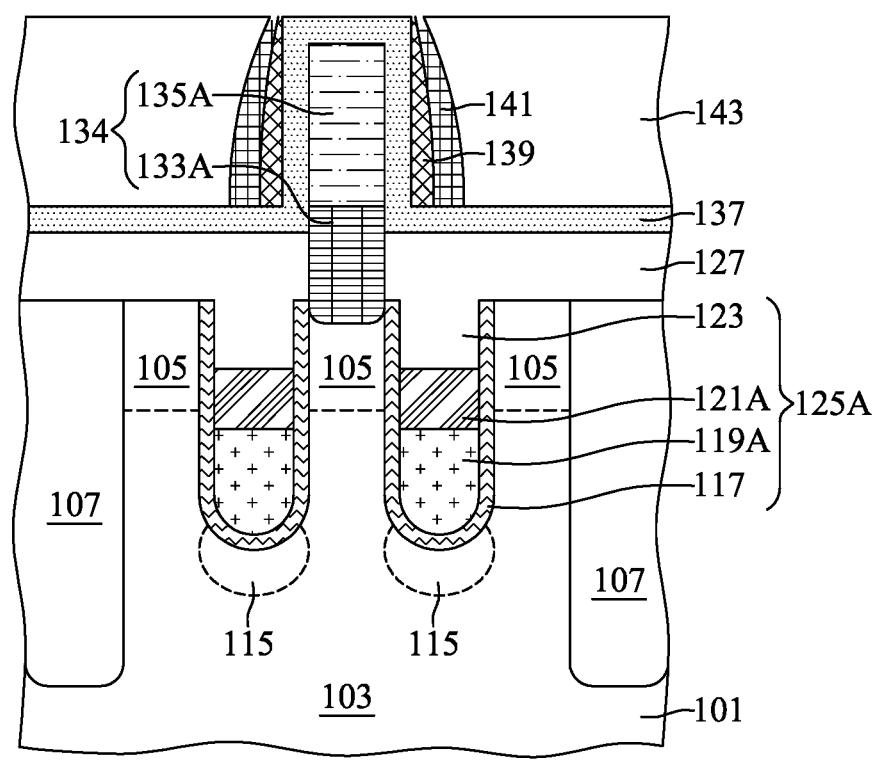

Referring to FIG. 17, fabrication processes are performed to form an intermediate interlayer dielectric layer 143, covering the exposed surfaces of the bit line capping layer 137 and the second bit line spacer 141. The forming of the intermediate interlayer dielectric layer 143 may include depositing a silicon nitride on the exposed surfaces of the bit line capping layer 137 and the second bit line spacer 141, and then performing a CMP process. The upper surface of the bit line capping layer 137 may be slightly removed by the CMP process and substantially coplanar with the upper surface of the intermediate interlayer dielectric layer 143. In addition, the CMP process also slightly removes the top portions of the first bit line spacer 139 and the second bit line spacer 141.

Figure 18:
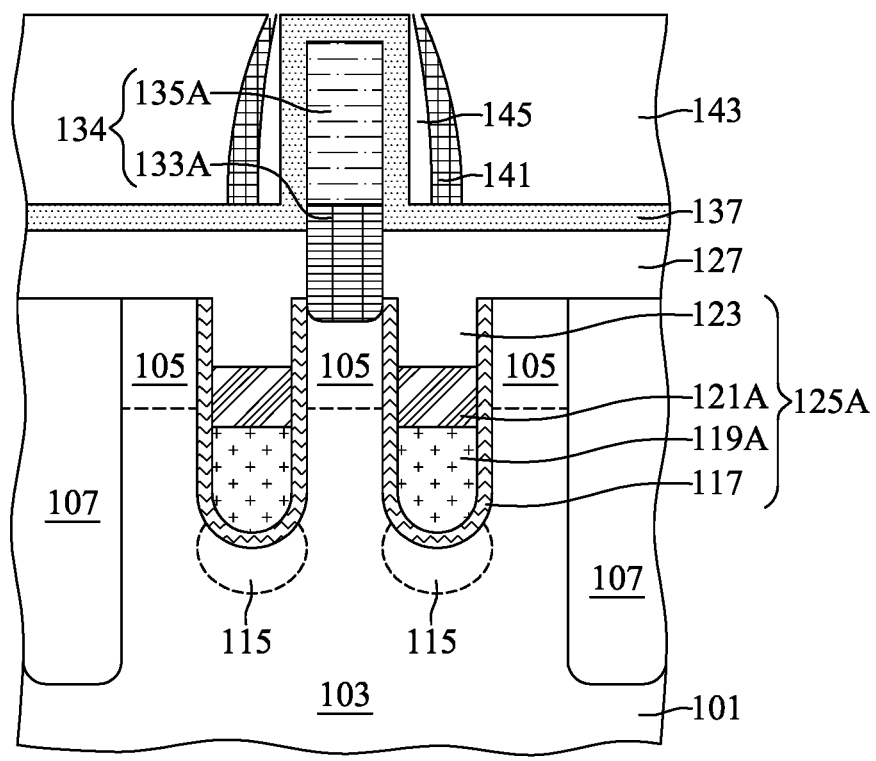

Referring to FIG. 18, fabrication processes are performed to form an air gap 145 on the sides of the lower bit line 133A and the upper bit line 135A, with the intervening bit line capping layer 137, by removing the first bit line spacer 139. In some embodiments, a vapor hydrogen fluoride may be introduced and may etch the first bit line spacer 139, with high etching selectivity between doped silicon oxide and silicon nitride. The vapor hydrogen fluoride has a higher etching rate on the first bit line spacer 139 formed of doped silicon oxide; therefore, the first bit line spacer 139 may be selectively removed, while the other layer (the second bit line spacer 141, the bit line capping layer 137, and the intermediate interlayer dielectric layer 143 formed of silicon nitride may be selectively retained.

In some embodiments, the bit line capping layer 137 prevents the lower bit line 133A and the upper bit line 135A from being etched by the vapor hydrogen fluoride. In addition, the bit line capping layer 137 also prevents the material of the lower bit line 133A and the upper bit line 135A from flowing into the air gap 145 during subsequent processing operations such as heat treatment.

With reference to FIG. 18, alternatively, in another embodiment, the first bit line spacer 139 is formed of thermal decomposable polymer or thermal degradable polymer, and a heat treating process is applied to remove the thermal decomposable polymer or thermal degradable polymer. A temperature of the heat process may be between about 300° C. and about 450° C. Preferably, the temperature of the heat process may be between about 350° C. and about 420° C.

Figure 19:
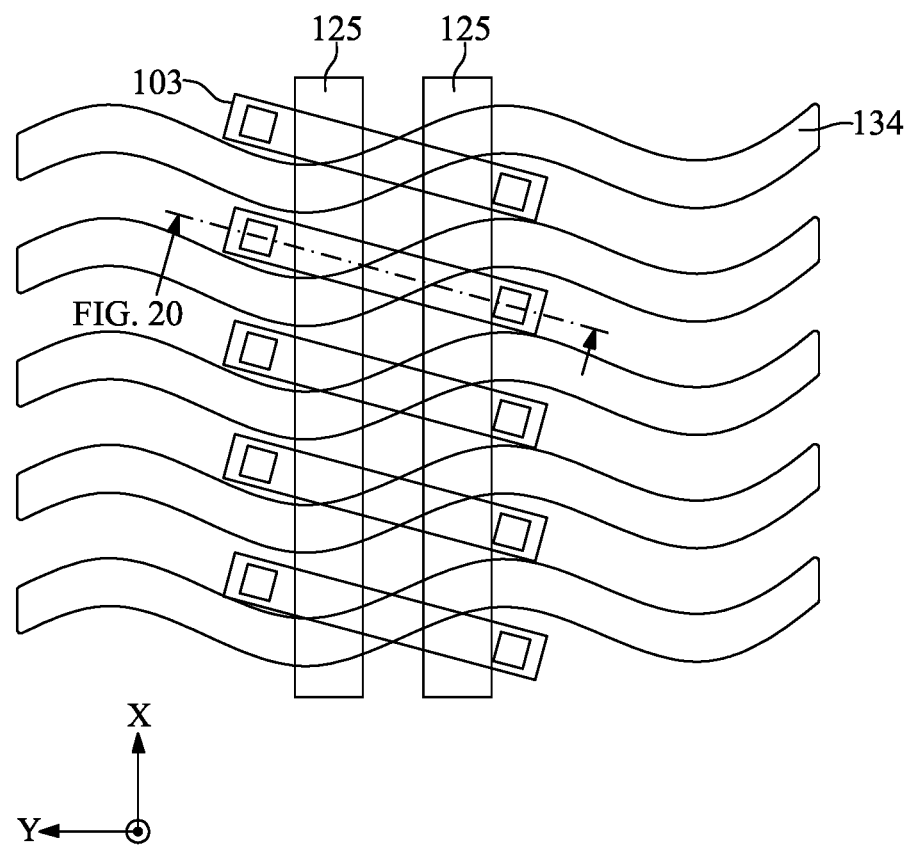
FIGS. 19-20 are top-view and cross-sectional view illustrating intermediate stages of forming a capacitor plug on the second doped region and a barrier layer on a sidewall of the capacitor plug at the step S19 in the method shown in FIG. 1, in accordance with some embodiments.
Figure 20:
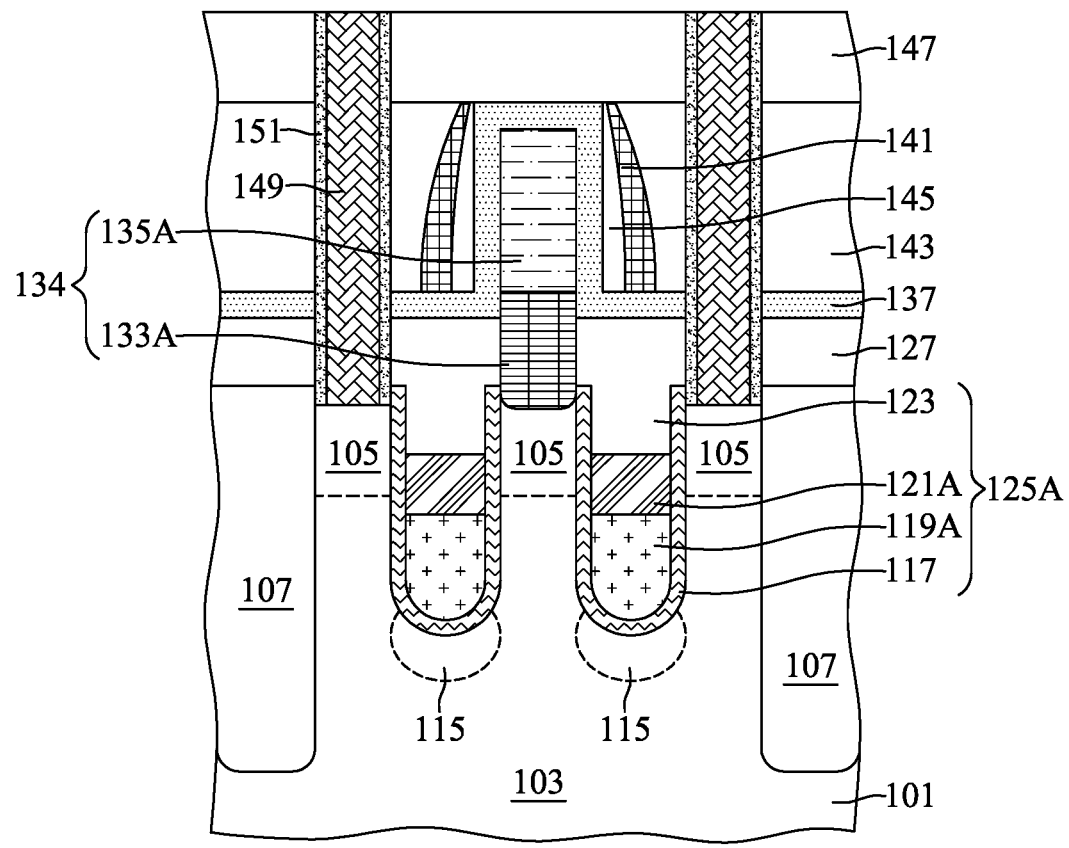

FIGS. 19-20 are top-view and cross-sectional view illustrating intermediate stages of forming a capacitor plug on the second doped region and a barrier layer on a sidewall of the capacitor plug at the step S19 in the method 10 shown in FIG. 1, in accordance with some embodiments. In some embodiments, referring to FIGS. 19-20, fabrication processes are performed to form a dielectric layer 147 on the intermediate interlayer dielectric layer 143 by deposition process, wherein the dielectric layer 147 covers the bit line capping layer 137 and the second bit line spacer 141, and seals the top portion of the air gap 145. Subsequently, a plurality of capacitor plugs 149 may be formed above the substrate 101.

In some embodiments, a photolithography process may be used to pattern the dielectric layer 147 to define positions of the plurality of capacitor plugs 149. An etch process, such as an anisotropic dry etch process, may be performed after the photolithography process to form a plurality of plug openings passing through the dielectric layer 147, the intermediate interlayer dielectric layer 143, the bit line capping layer 137, and the lower interlayer dielectric layer 127, to expose the source/drain region 105. After the etch process, a conductive material, for example, aluminum, copper, tungsten, cobalt, or other suitable metal or metal alloy is deposited, by a metallization process such as chemical vapor deposition, physical vapor deposition, sputtering, or the like, in the plurality of plug openings to form the plurality of capacitor plugs 149 over the source/drain region 105. In some embodiments, a plurality of barrier layers 151 may be formed on sidewalls of the capacitor plugs 149. The plurality of barrier layers 151 may include titanium (Ti), titanium nitride (TiN), or the combination thereof. A planarization process, such as chemical mechanical polishing, may be performed after the metallization process to remove excess deposited material and provide a substantially flat surface for subsequent processing steps.

In some embodiments, the air gap 145 is disposed between two conductive features, i.e., the bit line structure 134 and the capacitor plug 149. Therefore, the parasitic capacitance between the two conductive features may be reduced. As a result, the overall device performance may be improved (i.e., the decreased power consumption and resistive-capacitive (RC) delay), and the yield rate of the semiconductor device may be increased.

Figure 21:
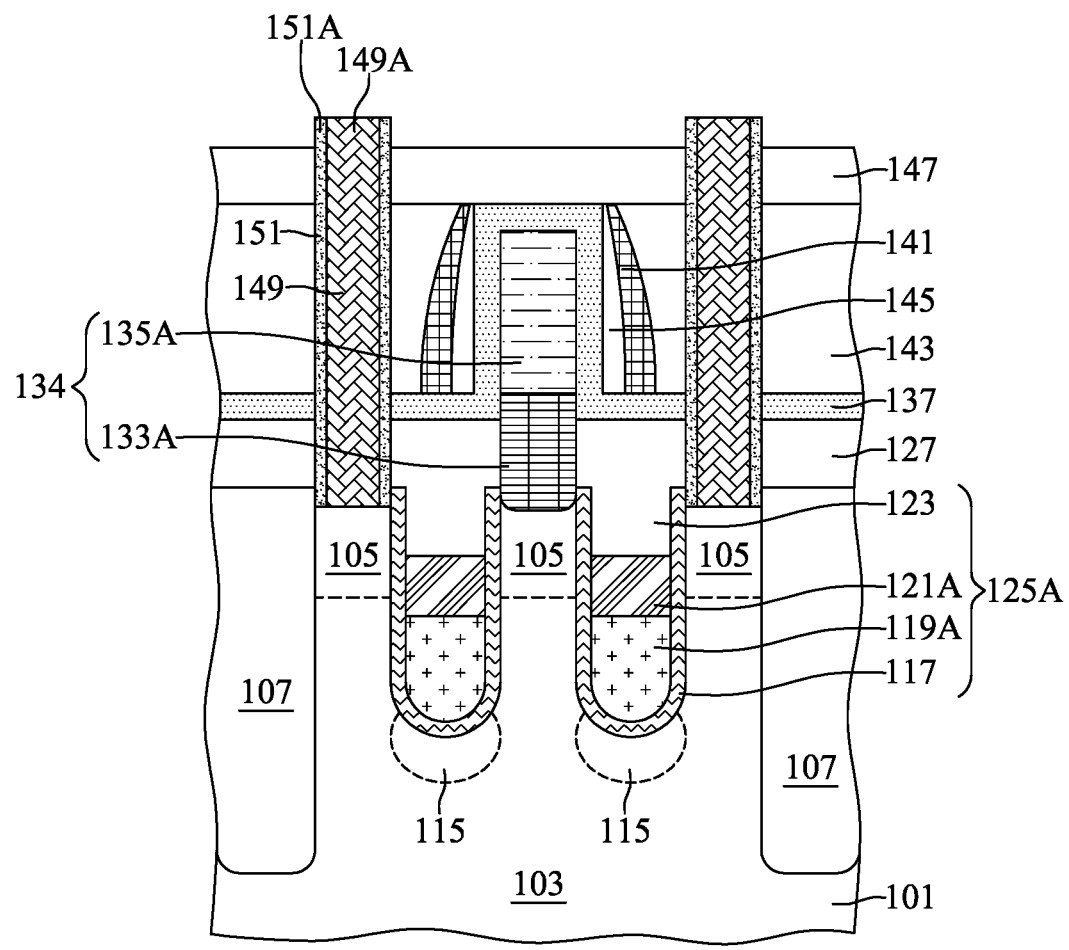
FIGS. 21-23 are cross-sectional views illustrating intermediate stages of forming a landing pad on a top portion of the capacitor plug at the step S21 in the method shown in FIG. 1, in accordance with some embodiments.
Figure 22:
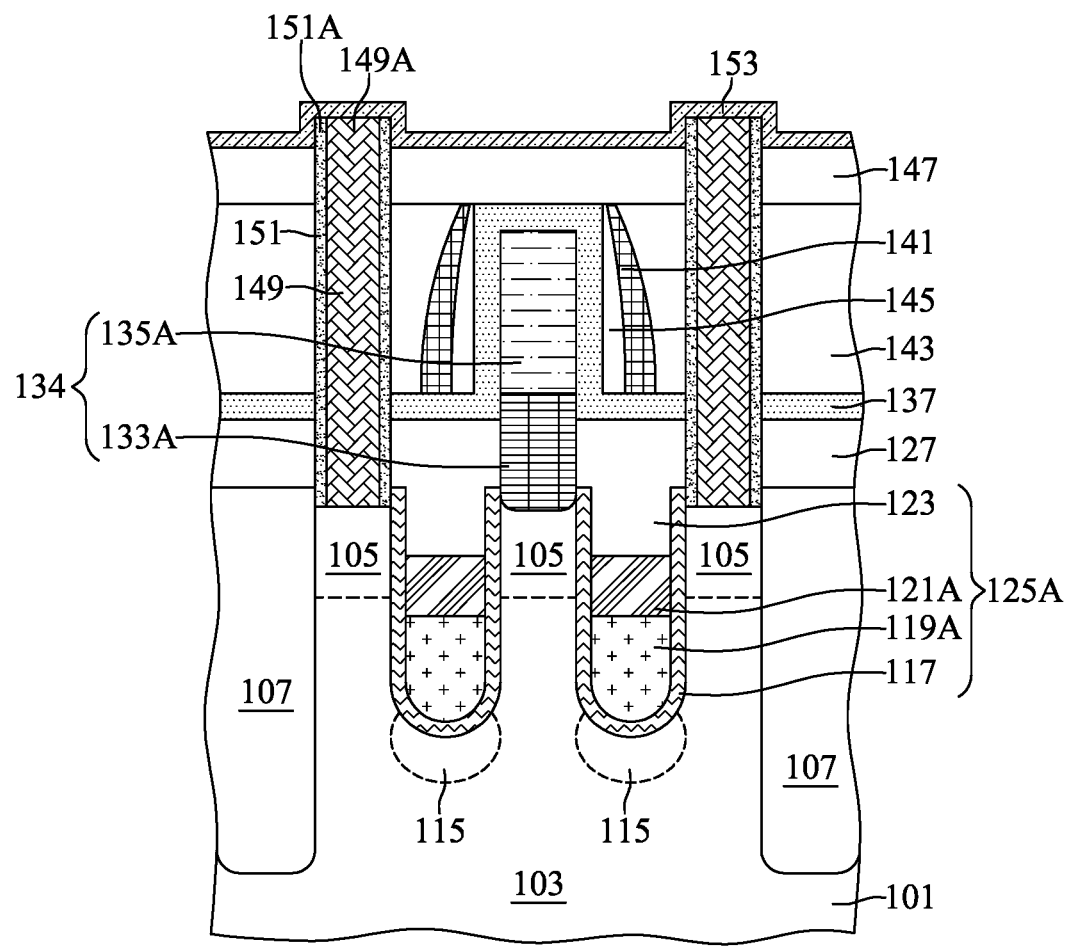
Figure 23:
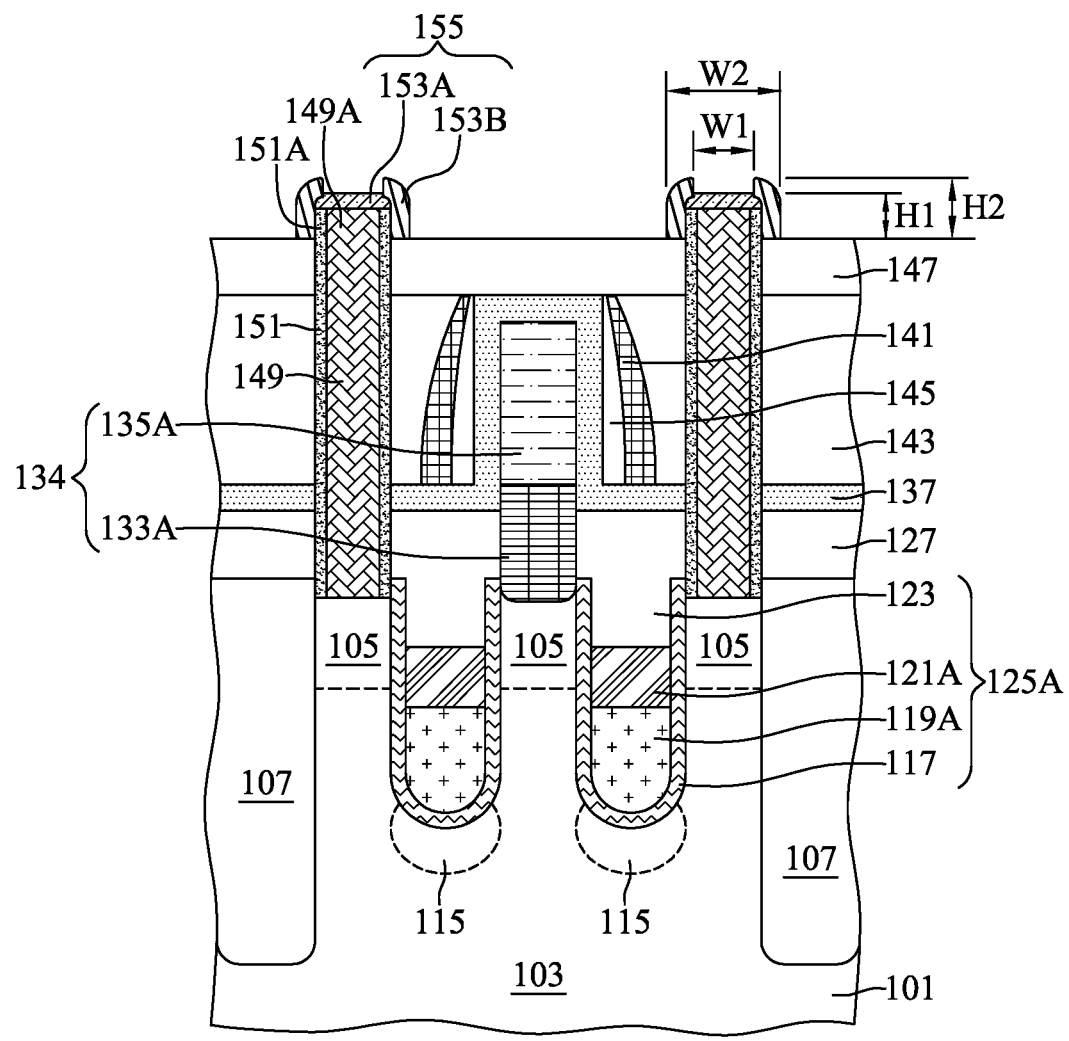

FIGS. 21-23 are cross-sectional views illustrating intermediate stages of forming a landing pad on a top portion of the capacitor plug at the step S21 in the method 10 shown in FIG. 1, in accordance with some embodiments. In some embodiments, referring to FIG. 21, an etching back process is performed to remove a top portion of the dielectric layer 147 to expose a protruding portion 149A of the capacitor plug 149 and a top portion 151A of the barrier layer 151. In some embodiments, after the etching back process, the top surface of the capacitor plug 149 is higher than that of the dielectric layer 147, and the sidewall of the top portion 151A is exposed.

With reference to FIG. 22, a deposition process is performed to form a liner layer 153, covering the top surface of the dielectric layer 147, the top surface of the protruding portion 149A, and the sidewall of the top portion 151A. In some embodiments, the liner layer 153 is a silicon-containing layer such as polysilicon layer.

With reference to FIG. 23, a salicidation process (thermal process) is performed to form a plurality of landing pads 155 over the dielectric layer 147, wherein the landing pad comprises the protruding portion 149A of the capacitor plug 411, the top portion 151A of the barrier layers 412, a first silicide layer (metal silicide) 153A over the protruding portion 149A, and a second silicide layer (metal silicide) 153B on a sidewall of the protruding portion 149A. In some embodiments, the thermal process transforms a portion of the protruding portion 149A and the liner layer 808 into the first silicide layer 153A. In some embodiments, the thermal process transforms the top portion 151A of the barrier layers 412 and the liner layer 808 into the second silicide layer 153B. In other words, the landing pad 155 is formed without using the lithographic technique, i.e., the landing pad 155 is self-aligned to the capacitor plug 411. In some embodiments, the thickness and shape of the protruding portion 149A and the top portion 151A may be changed (not shown in the drawings). Due to the self-aligned landing pad 155 having the metal silicide, wherein a width of the metal silicide layer 153B is larger than a width of the capacitor plug 149, the misalignment between the subsequently formed capacitor structure 167 and the landing pad 155 can be effectively solved.

In some embodiments, an etching process such as an anisotropic dry etching process is performed to remove a portion of the liner layer 153 not transformed into the metal silicide by the thermal process. In some embodiments, the salicidation process between the top portion 151A and the liner layer 153 is faster than that between the protruding portion 149A and the liner layer 153, and the top end of the second silicide layer 153B is higher than the top end of the first silicide layer 153A. In other words, the height H2 of the second silicide layer 153B is greater than the height H1 of the first silicide layer 153A, forming a step structure between the first silicide layer 808A and the second silicide layer 808B. In some embodiments, the second silicide layer 153B surrounds the first silicide layer 153A, and the width W2 of the second silicide layer 153B is greater than the width W1 of the first silicide layer 153A.

Figure 24:
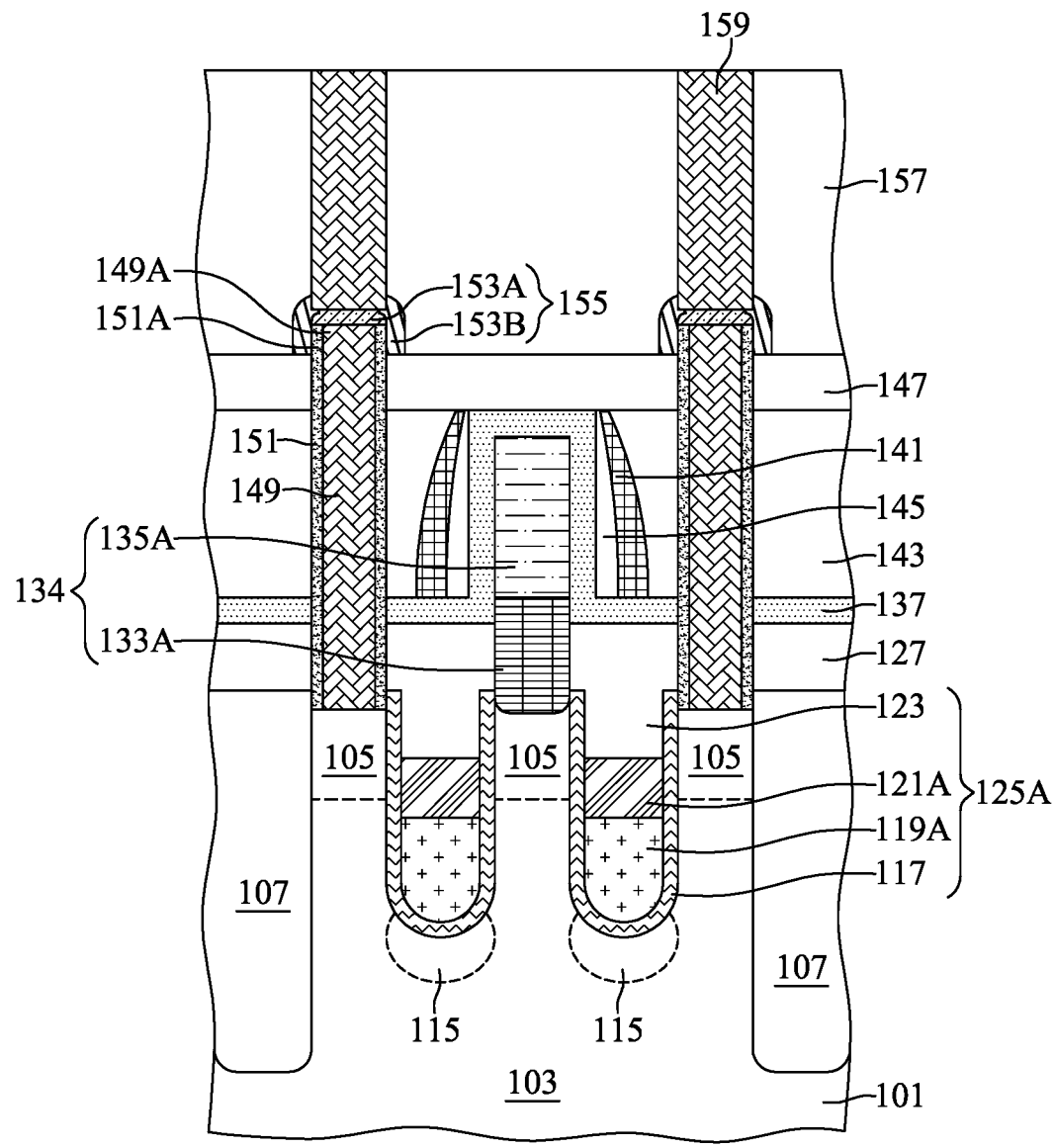
FIGS. 24-26 are cross-sectional views illustrating intermediate stages of forming a plurality of capacitor structures electrically connected respectively to the plurality of landing pads in accordance with some embodiments.
Figure 25:
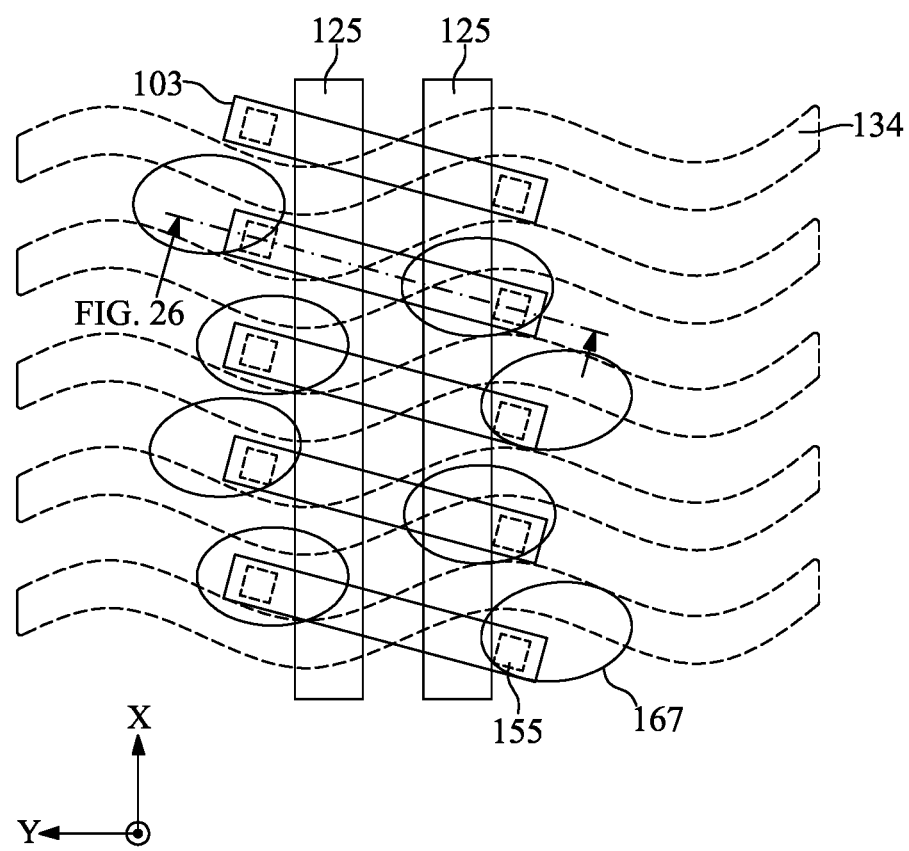
Figure 26:
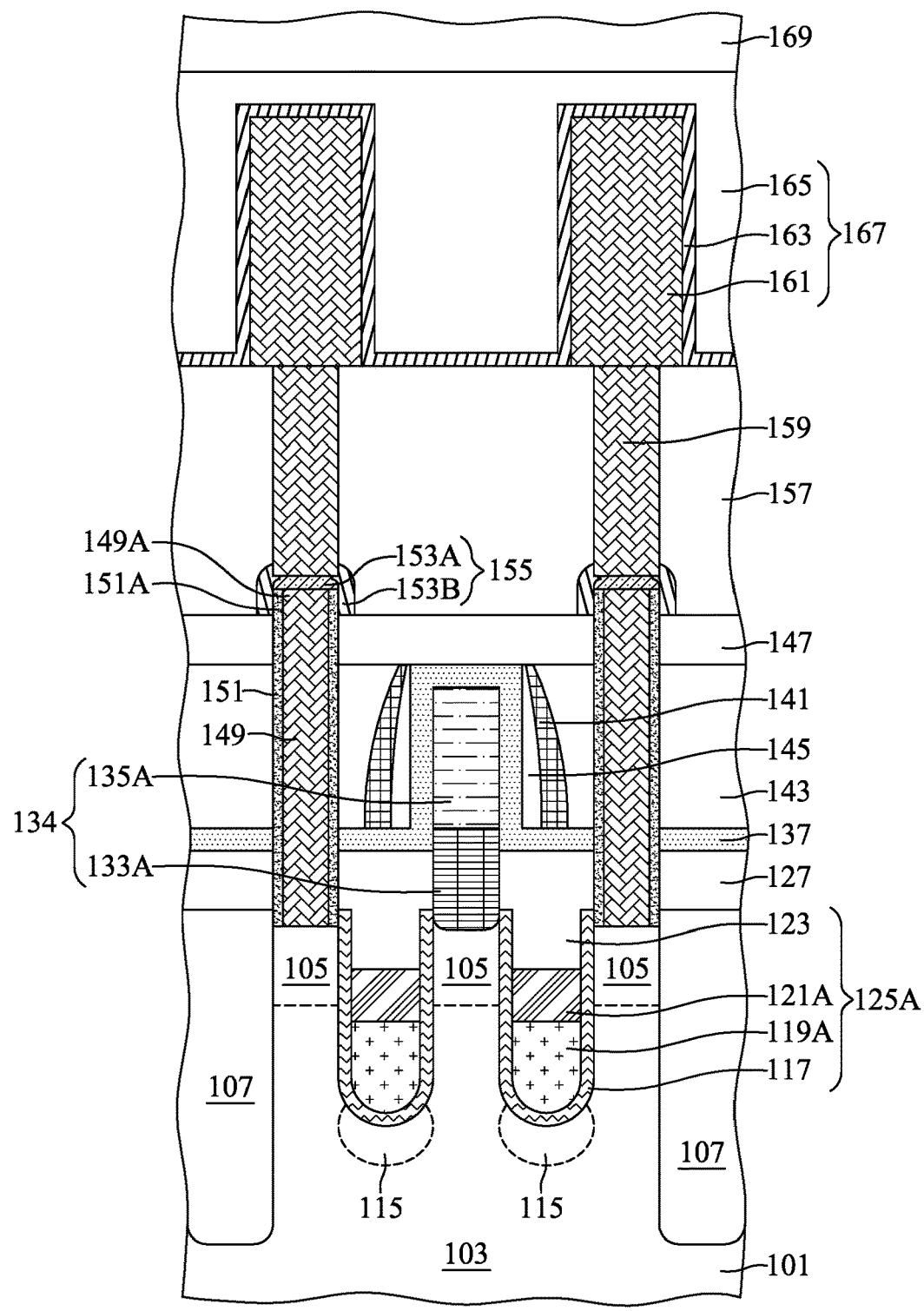

FIGS. 24-26 are cross-sectional views illustrating intermediate stages of forming a plurality of capacitor structures electrically connected respectively to the plurality of landing pads in accordance with some embodiments. In some embodiments, referring to FIG. 24, a dielectric layer 157 having a plurality of conductive plugs 159 may be formed over the landing pad 155. A photolithography process may be used to pattern the dielectric layer 157 to define positions of the plurality of plugs 149. An etch process, such as an anisotropic dry etch process, may be performed after the photolithography process to form a plurality of plug openings passing through the dielectric layer 157, exposing the landing pad 155. After the etch process, a conductive material, for example, aluminum, copper, tungsten, cobalt, or other suitable metal or metal alloy is deposited, by a metallization process such as chemical vapor deposition, physical vapor deposition, sputtering, or the like, in the plurality of plug openings to form the plurality of plugs 149 over the landing pad 155. A planarization process, such as chemical mechanical polishing, may be performed after the metallization process to remove excess deposited material and provide a substantially flat surface for subsequent processing steps.

FIG. 25 and FIG. 26 are top-view and cross-sectional view illustrating the forming of a plurality of capacitor structures electrically connected respectively to the plurality of landing pads in accordance with some embodiments. In some embodiments, a plurality of capacitor structures 167 are formed respectively over the plurality of landing pads 155 to complete the semiconductor memory device 10A. In some embodiments, the plurality of capacitor structures 167 may include a bottom electrode 161, a capacitor insulating layer 163, and a top electrode 165. In some embodiments, the method may include forming an upper dielectric layer 169 on the capacitor structures 167 through a deposition process. The upper dielectric layer 169 may include a dielectric material such as a silicon nitride or a silicon oxide.

With reference to FIG. 26, a plurality of bottom electrodes 161 may be correspondingly respectively formed over the landing pads 155, with the plurality of conductive plugs 159 electrically connecting the bottom electrodes 161 to the landing pads 155. The plurality of bottom electrodes 161 may be formed of, for example, doped polysilicon, metal silicide, aluminum, copper, or tungsten. The plurality of bottom electrodes 161 may be respectively correspondingly connected to the plurality of plugs 149.

In some embodiments, the capacitor insulating layer 163 may be conformally formed on sidewalls and top surfaces of the plurality of bottom electrodes 161 and the top surfaces of the dielectric 157. The capacitor insulating layer 163 may be a single layer or multiple layers. In the embodiment depicted, the capacitor insulating layer 163 may be a single layer or multiple layers. Specifically, the capacitor insulating layer 163 may be a single layer formed of a high dielectric constant material such as barium strontium titanate, lead zirconium titanate, titanium oxide, aluminum oxide, hafnium oxide, yttrium oxide, zirconium oxide, or the like. Alternatively, in another embodiment, the capacitor insulating layer 163 may be multiple layers consisting of silicon oxide, silicon nitride, and silicon oxide. In some embodiments, the top electrode 15 may be formed to f cover the capacitor insulating layer 163. The top electrode 15 may be formed of, for example, doped polysilicon, copper, or aluminum.

Figure 27:
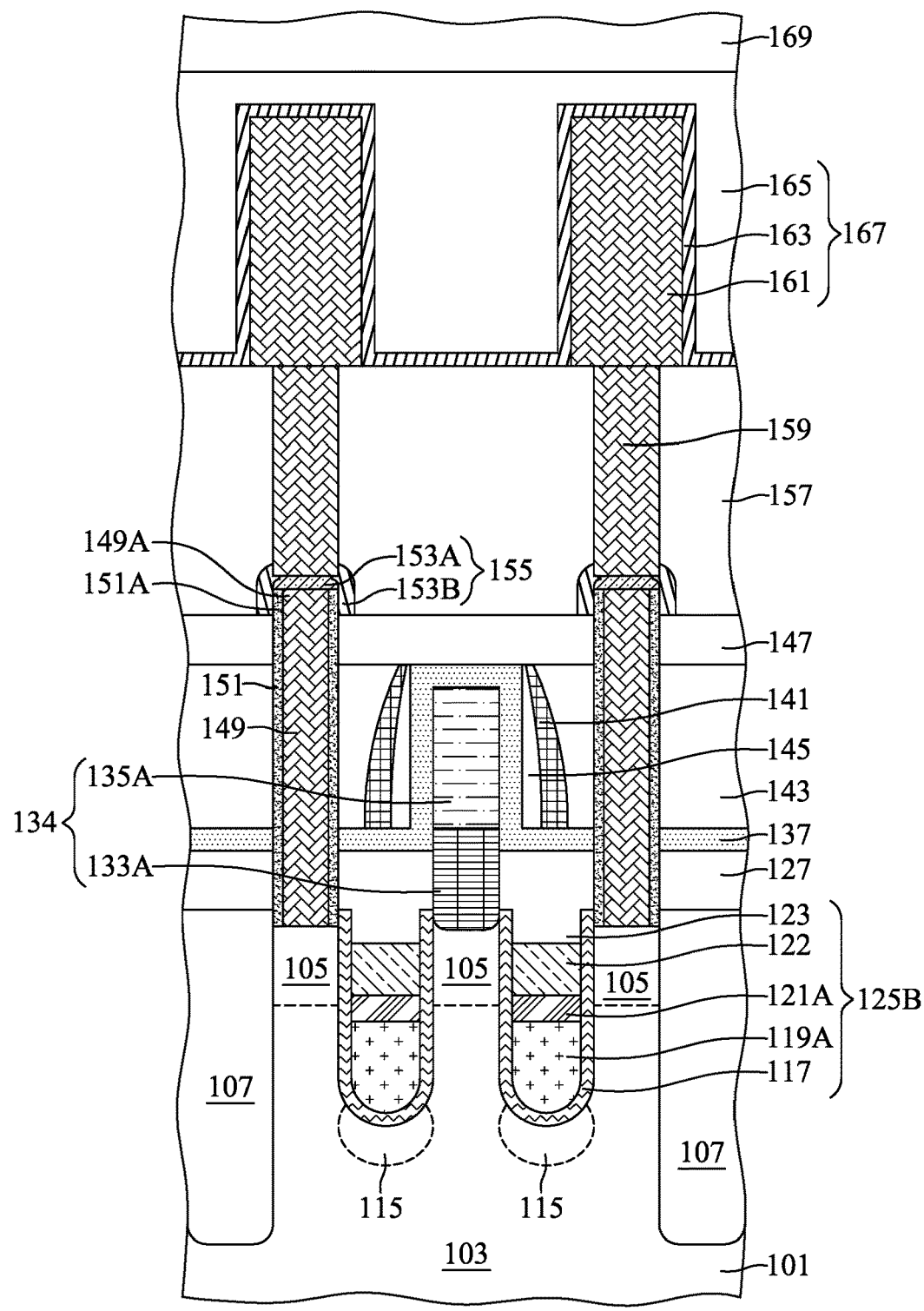
FIG. 27 is a cross-sectional view illustrating a semiconductor memory device in accordance with another embodiment of the present disclosure.

FIG. 27 is a cross-sectional view illustrating a semiconductor memory device 10B in accordance with another embodiment of the present disclosure. In some embodiments, compared with the semiconductor memory device 10A shown in FIG. 26, the semiconductor memory device 10B in FIG. 27 includes a gate structure 125B may include a gate dielectric layer 20, a lower gate electrode 119A, an upper gate electrode 121A, a capping gate electrode 122 and a gate capping layer 123.

In some embodiments, the gate dielectric layer 20 may be conformally disposed on the inner sidewalls of the gate trench 113 in a lining shape. The gate dielectric layer 20 may be configured as a layer lining the inner walls of the gate trench 113. The gate trench 113 may be a cylinder-like well, or as a slot-like element that extends in a linear direction through the substrate. The gate dielectric layer 20 may include an oxidized silicon layer, a silicon oxide layer, or a metal oxide layer having a high dielectric constant such as a hafnium oxide layer ($HfO_x$).

In some embodiments, the lower gate electrode 119A may have a rail-like or plug-like shape on a portion of the gate dielectric layer 20 in the gate trench 113, and may be positioned with an upper surface lower than a bottom surface of source/drain regions 105. A bottom surface and side surfaces of the lower gate electrode 119A may be surrounded by or be in contact with the gate dielectric layer 20. The lower gate electrode 119A may include a conductor having a relatively low work function. For example, the lower gate electrode 119A may include polysilicon doped with an N-type ion.

In some embodiments, the upper gate electrode 121A may have a rail-like or plug-like shape on the lower gate electrode 119A in the gate trench 113, and may be positioned with an upper surface lower than the bottom surface of the source/drain regions 105. The upper gate electrode 121A may include a conductor having a relatively higher work function than the lower gate electrode 119A. In addition, the upper gate electrode 121A may include a conductor having a lower resistance than the lower gate electrode 119A. For example, the upper gate electrode 121A may include a metal, a metal compound, or a metal alloy. Specifically, the upper gate electrode 121A may include tungsten (W) as a non-limiting example. In some embodiments, the upper gate electrode 121A may include a conductor having a relatively higher work function and a relatively lower resistance than the lower gate electrode 119A and remain capable of forming an ohmic contact. For example, the upper gate electrode 121A may include a barrier metal, such as a titanium nitride (TiN) as a non-limiting example.

In some embodiments, the capping gate electrode 122 may have a rail-like a plug-like shape on the upper gate electrode 121A in the gate trench 113. The capping gate electrode 122 may include polysilicon, for example, polysilicon doped with an N-type ion. The capping gate electrode 122 may prevent or reduce ion diffusion or ion migration between the upper gate electrode 121A and the gate capping layer 123. The capping gate electrode 122 may also improve the adhesion of the upper gate electrode 121A and the gate capping layer 123. For example, when the upper gate electrode 121A includes a metal and the gate capping layer 123 includes a silicon oxide, an oxygen atom may migrate from the gate capping layer 123 and diffuse into the upper gate electrode 121A, causing metal oxidization. Or, a metal atom may migrate from the upper gate electrode 121A and diffuse into the gate capping layer 123, causing an electromigration phenomenon. In addition, when the adhesion between the upper gate electrode 121A and the gate capping layer 123 is poor, a layer separation or a delamination defect may occur. The inclusion of the capping gate electrode 122 may prevent or limit the effect of these phenomena.

In some embodiments, the forming of the capping gate electrode 122 may include forming a capping gate electrode material layer on the upper gate electrode 121A in the gate trench 113 and the surface of the substrate 101, and then removing the upper portion of the capping gate electrode material layer through an etch-back process. The upper surface of the capping gate electrode 122 may be located in the gate trench 113. For example, the upper surface of the capping gate electrode 122 may be located at a higher level than the bottom or lowest portion of the source/drain region 105.

In some embodiments, the gate capping layer 123 may be disposed on the capping gate electrode 122 to fill the gate trench 113. Detailed descriptions of components, features and configurations of the cryogenic semiconductor device 10B that are the same as or similar to those of the cryogenic semiconductor device 10A described above may be applicable to but not repeated here.

Figure 28:
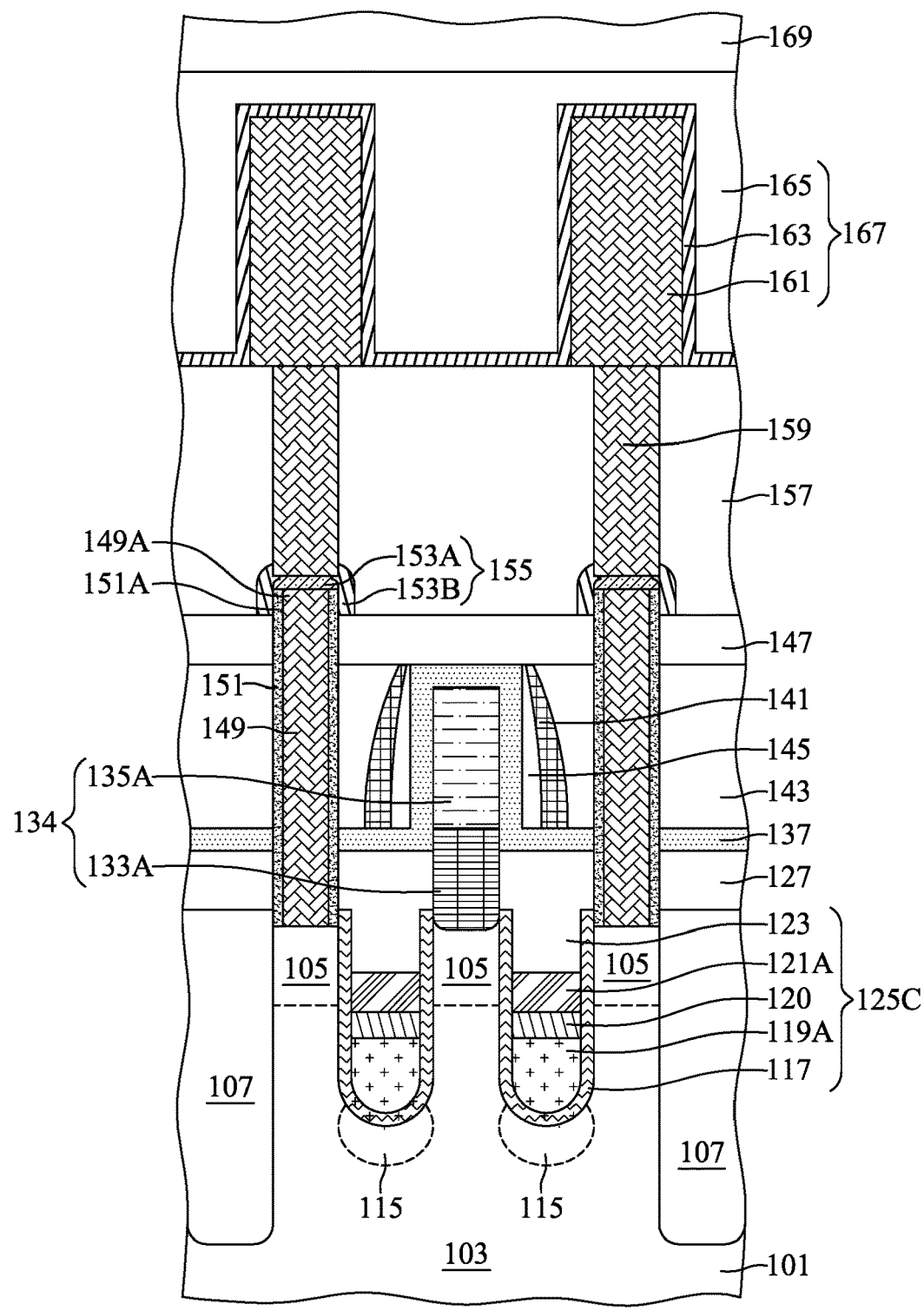
FIG. 28 is a cross-sectional view illustrating a semiconductor memory device in accordance with another embodiment of the present disclosure.

FIG. 28 is a cross-sectional view illustrating a semiconductor memory device 10C in accordance with another embodiment of the present disclosure. In some embodiments, compared with the semiconductor memory device 10A shown in FIG. 26, the semiconductor memory device 10C in FIG. 28 comprises a gate structure 125C including a gate dielectric layer 117, a lower gate electrode 119A, an intermediate gate electrode 120, an upper gate electrode 121A and a gate capping layer 123.

In some embodiments, the gate dielectric layer 117 may be conformally disposed on the inner sidewalls of the gate trench 113 in a lining shape. The gate dielectric layer 117 may include an oxidized silicon layer, a silicon oxide layer, or a metal oxide layer having a high dielectric constant such as a hafnium oxide layer ($HfO_x$).

In some embodiments, the lower gate electrode 119A may have a rail-like shape or a plug-like shape on a portion of the gate dielectric layer 117 in the gate trench 113, and may be positioned with an upper surface lower than a bottom surface of the source/drain region 15. The lower gate electrode 119A may include a conductor having a relatively low work function. For example, the lower gate electrode 119A may include polysilicon doped with an N-type ion.

In some embodiments, the intermediate gate electrode 120 may have a rail-like shape or a plug-like shape on the lower gate electrode 119A in the gate trench 113, and may be positioned with an upper surface lower than the bottom surface of the source/drain region 15. The intermediate gate electrode 120 may include a conductor capable of forming an ohmic contact that prevents physical and chemical reactions between the lower gate electrode 119A and the upper gate electrode 121A. For example, the intermediate gate electrode 120 may include a barrier metal such as a titanium nitride (TiN). The intermediate gate electrode 120 may have a work function that is relatively higher than the work function of the lower gate electrode 119A and relatively lower than the work function of the upper gate electrode 121A. The intermediate gate electrode 120 may have a resistance that is relatively lower than the resistance of the lower gate electrode 119A and relatively higher than the resistance of the upper gate electrode 121A.

In some embodiments, the forming of the intermediate gate electrode 120 may include forming an intermediate gate electrode material layer on the lower gate electrode 119A in the gate trench 113 through the series of processes described above with reference to the formation of the upper gate electrode 121A. In some embodiments, the forming of the intermediate gate electrode 120 may include removing the upper portion of the intermediate gate electrode material layer through an etch-back process. The intermediate gate electrode 120 may be located approximately in the middle of the gate trench 113. The upper surface of the intermediate gate electrode 120 may be located at a lower level than the bottom or lowermost region of the source/drain region 105.

In some embodiments, the upper gate electrode 121A may have a rail-like or plug-like shape or geometry on the intermediate gate electrode 120 in the gate trench 113. The upper gate electrode 121A may include a conductor having a relatively high work function and a relatively low resistance compared to both the intermediate gate electrode 120 and the lower gate electrode 119A. For example, the upper gate electrode 121A may include a metal.

In some embodiments, the gate capping layer 123 may be disposed on the upper gate electrode 121A to fill the gate trench 113. The gate capping layer 123 may include a dielectric material that does not physically and chemically react with the upper gate electrode 121A. For example, the gate capping layer 123 may include a silicon nitride. Detailed descriptions of the components, features and configurations of the cryogenic semiconductor device 10C that are the same as or similar to those of the cryogenic semiconductor device 10A described above may be applicable to but not repeated here.

Figure 29:
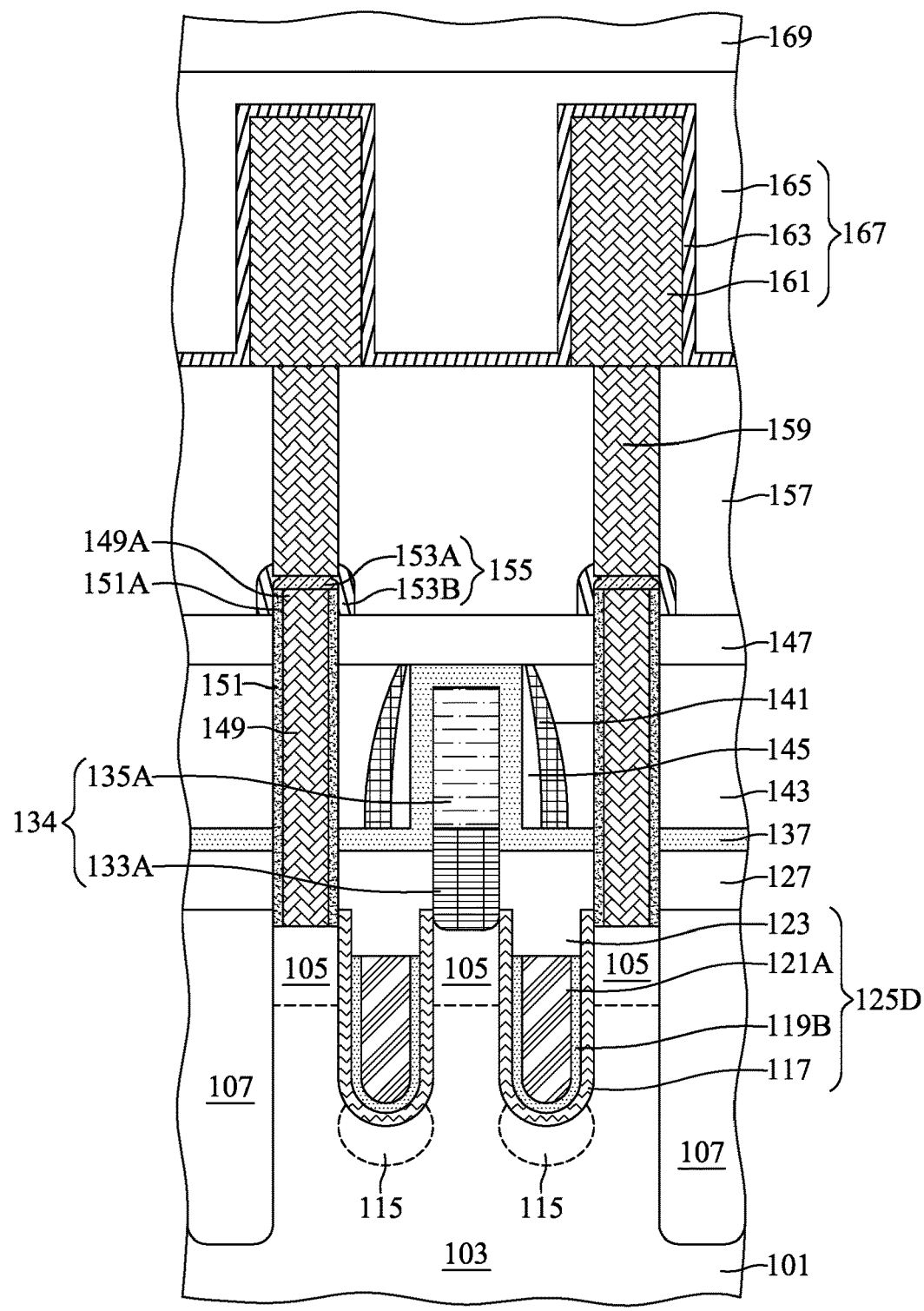
FIG. 29 is a cross-sectional view illustrating a semiconductor memory device in accordance with another embodiment of the present disclosure.

FIG. 29 is a cross-sectional view illustrating a semiconductor memory device 10D in accordance with another embodiment of the present disclosure. In some embodiments, compared with the semiconductor memory device 10A shown in FIG. 26, the semiconductor memory device 10D in FIG. 29 comprises a gate structure 125D including a gate dielectric layer 117, a lower gate electrode 119B, an upper gate electrode 121A and a gate capping layer 123.

In some embodiments, the gate dielectric layer 117 may be conformally disposed on the sidewalls of the gate trench 113 in a lining shape. The gate dielectric layer 117 may include an oxidized silicon layer, a silicon oxide layer, or a metal oxide layer having a high dielectric constant such as a hafnium oxide layer (HfO$_x$).

In some embodiments, the lower gate electrode 119B may be conformally disposed on at least a portion of the gate dielectric layer 117 in the gate trench 113. As an example, both of the gate dielectric layer 117 and the lower gate electrode 119B can have a cup-like or bowl-like cross-sectional shape as illustrated in FIG. 1D. The lower gate electrode 119B may include a conductor having a relatively low work function. For example, the lower gate electrode 119B may include polysilicon doped with an N-type ion. In some embodiments, the lower gate electrode 119B on the gate dielectric layer 117 in the gate trench 113, can be formed through the series of processes described above, similar to the fabrication processes for the gate dielectric layer 117.

In some embodiments, the upper gate electrode 121A may have a rail-like or plug-like shape on the lower gate electrode 119B in the gate trench 113. The upper gate electrode 121A may include a conductor having a relatively high work function and a relatively low resistance. For example, the upper gate electrode 121A may include a metal. In some embodiments, the upper gate electrode 121A may include a conductor having a lower resistance than the lower gate electrode 119B. For example, the upper gate electrode 121A may include a metal, a metal compound, or a metal alloy. Specifically, the upper gate electrode 121A may include tungsten (W) as a non-limiting example. In other embodiments, the upper gate electrode 121A may include a conductor having a higher work function and a lower resistance than the lower gate electrode 119B and remain capable of forming an ohmic contact. For example, the upper gate electrode 121A may include a barrier metal, such as a titanium nitride (TiN) as a non-limiting example.

In some embodiments, the gate capping layer 123 may be disposed on the upper gate electrode 121A to fill the gate trench 113. The gate capping layer 123 may include a dielectric material that does not physically and chemically react with the upper gate electrode 121A. For example, the gate capping layer 123 may include a silicon nitride. When the upper gate electrode 121A includes a barrier metal, the gate capping layer 123 may include a silicon oxide.

In some embodiments, the upper surfaces of the lower gate electrode 119B and the upper gate electrode 121A may be located at a relatively higher level than the bottom or lowest portion of the source/drain region 15. A channel region of the gate structure 125E develop in the substrate 101 in an area spaced apart from lower gate electrode 119B by gate dielectric layer 117. Detailed descriptions of the components, features and configurations of the semiconductor memory device 10D that are the same as or similar to those of the semiconductor memory device 10A described above may be applicable to but not repeated here.

Figure 30:
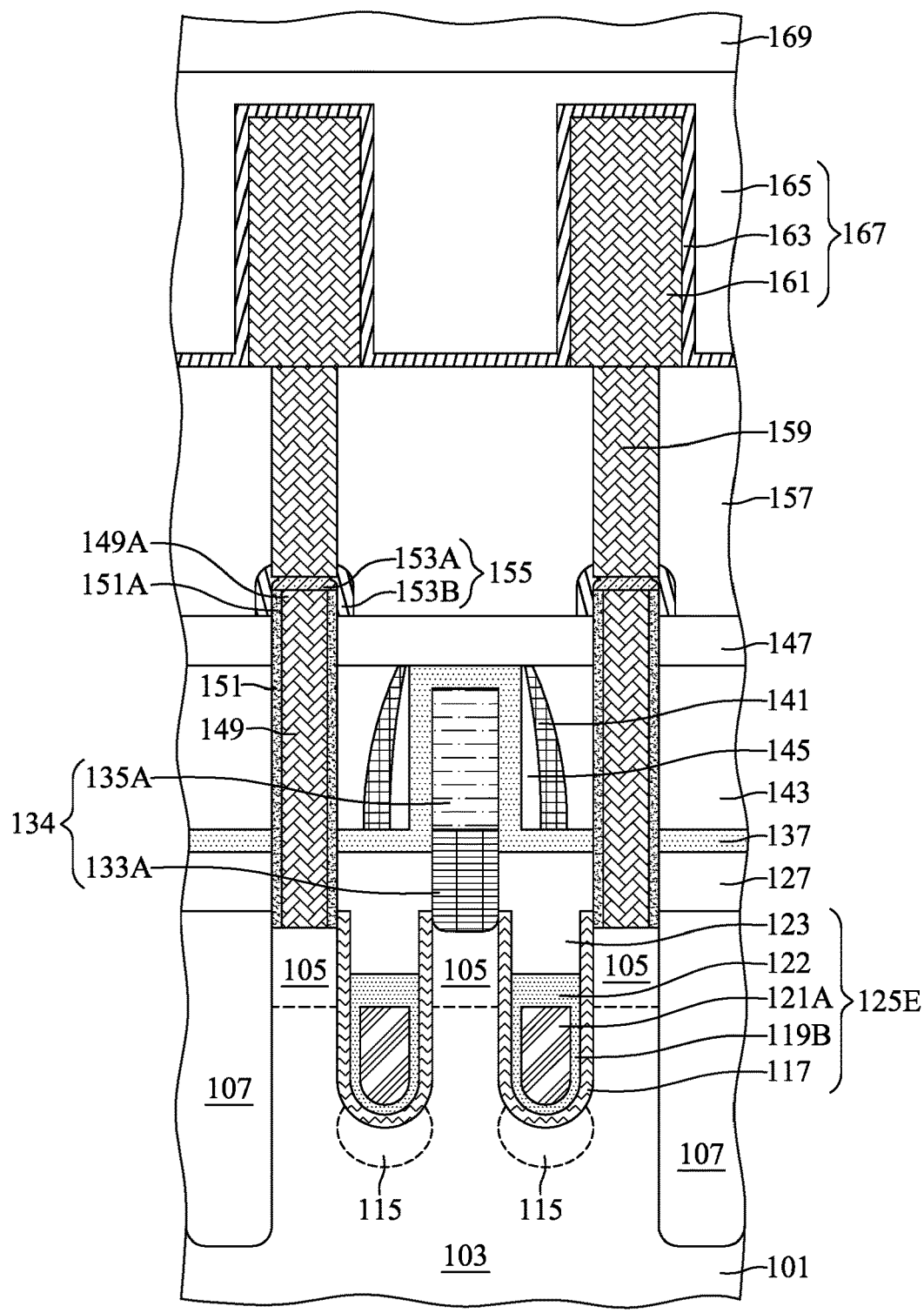
FIG. 30 is a cross-sectional view illustrating a semiconductor memory device in accordance with another embodiment of the present disclosure.

FIG. 30 is a cross-sectional view illustrating a semiconductor memory device 10E in accordance with another embodiment of the present disclosure. In some embodiments, compared with the semiconductor memory device 10A shown in FIG. 26, the semiconductor memory device 10E in FIG. 30 comprises a gate structure 125E including a gate dielectric layer 117, a lower gate electrode 119B, an intermediate gate electrode 41, an upper gate electrode 121A, a lower capping gate electrode 42, an upper capping gate electrode 32, and a gate capping layer 123.

In some embodiments, the lower gate electrode 119B may include a conductor having a relatively low work function. For example, the lower gate electrode 119B may include polysilicon doped with an N-type ion.

In some embodiments, the upper gate electrode 121A may include a conductor having a relatively high work function and a relatively low resistance. For example, the upper gate electrode 121A may include a metal. The upper gate electrode 121A may include a conductor capable of forming an ohmic contact with the lower gate electrode 119B. For example, the upper gate electrode 121A may include a barrier metal such as a titanium nitride (TiN). The upper gate electrode 121A may have a higher work function and a lower resistance than the lower gate electrode 119B.

In some embodiments, the capping gate electrode 122 may include polysilicon doped with an N-type ion. The capping gate electrode 122 may prevent or mitigate an ion diffusing or migrating between the upper gate electrode 121A and the gate capping layer 123. The capping gate electrode 122 may also improve the adhesion of the upper gate electrode 121A and the gate capping layer 123. In some embodiments, the capping gate electrode material layer 122a may include the same material as the lower gate electrode material layer 119B. Specifically, the capping gate electrode material layer 122a may include polysilicon doped with an N-type ion. Detailed descriptions of the components, features and configurations of the semiconductor memory device 10E that are the same as or similar to those of the semiconductor memory device 10A described above may be applicable to but not repeated here One aspect of the present disclosure provides a semiconductor memory device comprising: a substrate; an isolation member defining an active region having a first P-type ion concentration in the substrate; a gate structure disposed in the substrate; a first doped region positioned at a first side of the gate structure in the active region; a second doped region positioned at a second side of the gate structure in the active region; a bit line positioned on the first doped region; an air gap positioned adjacent to the bit line; a capacitor plug disposed on the second doped region and a barrier layer on a sidewall of the capacitor plug; and a landing pad on a top portion of the capacitor plug, wherein the landing pad comprises a first silicide layer disposed over a protruding portion of the capacitor plug, and a second silicide layer disposed on a sidewall of the barrier layer.

Another aspect of the present disclosure provides method for preparing a semiconductor memory device, comprising: forming an isolation member defining an active region in a substrate and a doped area in the active region; forming a gate structure in the substrate, wherein the gate structure divides the doped are into a first doped region and a second doped region; forming a bit line structure on the first doped region; forming an air gap adjacent to the bit line structure; forming a capacitor plug on the second doped region and a barrier layer on a sidewall of the capacitor plug; and forming a landing pad on a top portion of the capacitor plug, wherein the landing pad comprises a first silicide layer over the protruding portion and a second silicide layer on a sidewall of the barrier layer.

Due to the introduction of the air gap between two conductive features, i.e., the bit line structure and the capacitor plug, the parasitic capacitance between the two conductive features can be effectively reduced. As a result, the overall device performance may be improved (i.e., the decreased power consumption and resistive-capacitive (RC) delay), and the yield rate of the semiconductor device may be increased.

Furthermore, due to the self-aligned landing pad having the metal silicide, wherein a width of the metal silicide layer is larger than a width of the capacitor plug, the misalignment between the subsequently formed capacitor structure and the landing pad can be effectively solved.

In addition, the work-function adjustment layer having a relatively low work function is disposed outside the conductive layer of the gate structure to reduce or minimize a gate-induced drain leakage current (GIDL) generated from the word line to the doped regions.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for preparing a semiconductor memory device, comprising:
   forming an isolation member defining an active region in a substrate and a doped area in the active region, wherein the active region has a first P-type ion concentration in the substrate;
   forming a gate structure in the substrate, wherein the gate structure divides the doped area into a first doped region and a second doped region;
   forming a bit line structure on the first doped region;
   forming an air gap adjacent to the bit line structure;
   forming a capacitor plug on the second doped region and a barrier layer on a sidewall of the capacitor plug;
   disposing a bit line spacer between the air gap and the barrier layer; and
   forming a landing pad on a top portion of the capacitor plug, wherein the landing pad comprises a first silicide layer over the protruding portion and a second silicide layer on a sidewall of the barrier layer.

2. The method for preparing a semiconductor memory device of claim 1, wherein forming the gate structure in the substrate comprises:
   forming a gate trench in the substrate;
   conformally forming a gate dielectric layer on inner sidewalls of the gate trench;
   forming a lower gate electrode on the gate dielectric layer; and
   forming an upper gate electrode disposed on the lower gate electrode, wherein the lower gate electrode has a relatively lower work function than the upper gate electrode.

3. The method for preparing a semiconductor memory device of claim 2, wherein the lower gate electrode includes polysilicon is doped with an N-type ion, and the lower gate electrode is conformally disposed on the gate dielectric layer.

4. The method for preparing a semiconductor memory device of claim 2, further comprising: conformally forming an intermediate gate electrode between the lower gate electrode and the upper gate electrode, wherein the intermediate gate electrode includes a barrier metal.

5. The method for preparing a semiconductor memory device of claim 2, wherein the upper gate electrode includes a metal, a metal alloy, or a metal compound, and the upper gate electrode fills the gate trench and has a rail-like shape.

6. The method for preparing a semiconductor memory device of claim 2, further comprising: forming a capping gate electrode covering an upper surface of the upper gate electrode, wherein the capping gate electrode includes a lower capping gate electrode and an upper capping gate electrode disposed on the lower capping gate electrode, and the lower capping gate electrode includes a barrier metal, and the upper capping gate electrode includes polysilicon doped with an N-type ion.

7. The method for preparing a semiconductor memory device of claim 1, wherein forming the air gap adjacent to the bit line structure comprises:

forming a bit line capping layer surrounding an exposed surface of the bit line structure;

configuring the bit line spacer to have a first bit line spacer and a second bit line spacer, wherein the first bit line spacer and the second bit line spacer are disposed between the air gap and the barrier layer;

forming the first bit line spacer on sides of the bit line structure, with the bit line capping layer between the bit line structure and the first bit line spacer;

forming the second bit line spacer on sides of the first bit line spacer; and performing an etching process to remove the first bit line spacer and to remain the second bit line spacer between the air gap and the barrier layer.

8. The method for preparing a semiconductor memory device of claim 1, wherein forming the landing pad on a top portion of the capacitor plug comprises:

exposing a protruding portion of the capacitor plug and a top portion of the barrier layer;

forming a liner layer covering the capacitor plug and the barrier layer; and performing a thermal process to form a landing pad over the dielectric layer, wherein the thermal process transforms a portion of the protruding portion and the liner layer into the first silicide layer, and the thermal process transforms a portion of the top portion of the barrier layers and the liner layer into the second silicide layer.

9. The method for preparing a semiconductor memory device of claim 1, wherein after a thermal process, a top end of the second silicide layer is higher than a top end of the first silicide layer, and the second silicide layer surrounds the first silicide layer.

10. The method for preparing a semiconductor memory device of claim 1, wherein the first silicide layer and the second silicide layer comprise polysilicon, the first silicide layer comprises tungsten, and the second silicide layer comprises titanium.

* * * * *